(12) United States Patent
Setsompop et al.

(10) Patent No.: US 9,897,675 B2
(45) Date of Patent: Feb. 20, 2018

(54) MAGNETIC RESONANCE FINGERPRINTING (MRF) WITH SIMULTANEOUS MULTIVOLUME ACQUISITION

(71) Applicant: Case Western Reserve University, Cleveland, OH (US)

(72) Inventors: Kawin Setsompop, Cambridge, MA (US); Mark Griswold, Shaker Heights, OH (US); Huihui Ye, Malden, MA (US); Lawrence Wald, Cambridge, MA (US); Dan Ma, Cleveland Heights, OH (US); Yun Jiang, Cleveland Heights, OH (US)

(73) Assignees: Case Western Reserve University, Cleveland, OH (US); THE GENERAL HOSPITAL CORPORATION, Boston, MA (US)

( * ) Notice: Subject to any disclaimer, the term of this patent is extended or adjusted under 35 U.S.C. 154(b) by 414 days.

(21) Appl. No.: 14/711,879

(22) Filed: May 14, 2015

(65) Prior Publication Data

US 2015/0346300 A1    Dec. 3, 2015

Related U.S. Application Data

(60) Provisional application No. 62/003,714, filed on May 28, 2014.

(51) Int. Cl.
*G01R 33/50* (2006.01)
*G01R 33/48* (2006.01)
*G01R 33/561* (2006.01)

(52) U.S. Cl.
CPC ........ *G01R 33/4828* (2013.01); *G01R 33/50* (2013.01); *G01R 33/4824* (2013.01); *G01R 33/5611* (2013.01); *G01R 33/5613* (2013.01)

(58) Field of Classification Search
CPC combination set(s) only.
See application file for complete search history.

(56) References Cited

U.S. PATENT DOCUMENTS

2012/0235678 A1\* 9/2012 Seiberlich .............. G01R 33/56
324/307

\* cited by examiner

*Primary Examiner* — Vincent Q Nguyen
(74) *Attorney, Agent, or Firm* — Quarles & Brady LLP

(57) ABSTRACT

Magnetic resonance fingerprinting (MRF) with simultaneous multivolume acquisition (SMVA) is described. One example nuclear magnetic resonance (NMR) apparatus includes an NMR logic that repetitively and variably samples (k, t, E) spaces associated with different volumes (e.g., slices) in an object to simultaneously acquire sets of NMR signals that are associated with different points in the (k, t, E) spaces. Sampling is performed with t and/or E varying in a non-constant way. The NMR apparatus may also include a signal logic that produces an NMR signal evolution from the NMR signals and compares the NMR signal evolution to reference signal evolutions. Since different volumes are excited differently, resulting signal evolutions can be acquired simultaneously from the different volumes and NMR parameters may be simultaneously determined for the multiple volumes, which reduces acquisition time and parameter map creation time.

48 Claims, 24 Drawing Sheets

MAGNETIC RESONANCE FINGERPRINTING (MRF) WITH SIMULTANEOUS MULTIVOLUME ACQUISITION

CROSS REFERENCE TO RELATED APPLICATIONS

This application claims priority to U.S. Provisional Patent Application 62/003,714 filed May 28, 2014, which is incorporated herein by reference.

FEDERAL FUNDING NOTICE

The invention was made with government support under Federal Grants 1ROOEB012107, 1RO1EB017219, RO1EB017337, P41EB015896, and 1RO1MH093765 awarded by the NIH. The Government has certain rights in the invention.

BACKGROUND

A slice-selective, highly under-sampled spiral or echo-planar imaging (EPI) k-space acquisition may be used for conventional two-dimensional magnetic resonance fingerprinting (MRF) acquisitions. Data may be acquired at 1000-2000 time points for a slice to be imaged. The data may be acquired during an acquisition time of approximately 10 milliseconds. Acquiring 1000-2000 data points using acquisition times of approximately 10 ms apiece results in an acquisition time of around 10-20 seconds per slice to be imaged using conventional MRF. Creating a high-resolution volumetric parameter map for slices that are 1 mm thick may involve imaging approximately 120 slices. This results in a total acquisition time of 20-40 minutes for conventional MRF. Faster imaging may be desired.

Conventional magnetic resonance imaging (MRI) may be constrained by the number of acquisition parameters that can be varied from signal acquisition period to signal acquisition period. Conventional multi-slice MRI may also be constrained by the number of acquisition parameters or acquisition conditions that can be varied from slice to slice during a single image acquisition. These constraints may lead to longer than desired acquisition times. Magnetic resonance fingerprinting (MRF) is not so constrained. MRF has more freedom based, at least in part, on how MRF produces nuclear magnetic resonance (NMR) that produces signal evolutions that include complex values with arbitrary phase relationships.

Characterizing resonant species using NMR can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using MRF, which is described in *Magnetic Resonance Fingerprinting*, Ma D et al., Nature 2013:495(7440): 187-192 and in U.S. Pat. No. 8,723,518, which is incorporated herein by reference.

Conventional magnetic resonance (MR) pulse sequences include similar repetitive preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time (TE) while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation). These conventional pulse sequences tend to be similar to identical when applied to different slices of an object.

Unlike conventional MRI, MRF employs a series of varied sequence blocks that simultaneously produce different signal evolutions in different resonant species (e.g., tissues) to which the RF is applied. The term "resonant species", as used herein, refers to an item (e.g., water, fat, tissue, material) that can be made to resonate using NMR. By way of illustration, when RF energy is applied to a volume that has bone and muscle tissue, then both the bone and muscle tissue will produce an NMR signal. However the "bone signal" and the "muscle signal" will be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include simultaneously identifying MR parameters associated with the resonant species. The "known" evolutions may be, for example, simulated evolutions or previously acquired evolutions. A large set of known evolutions may be stored in a dictionary.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
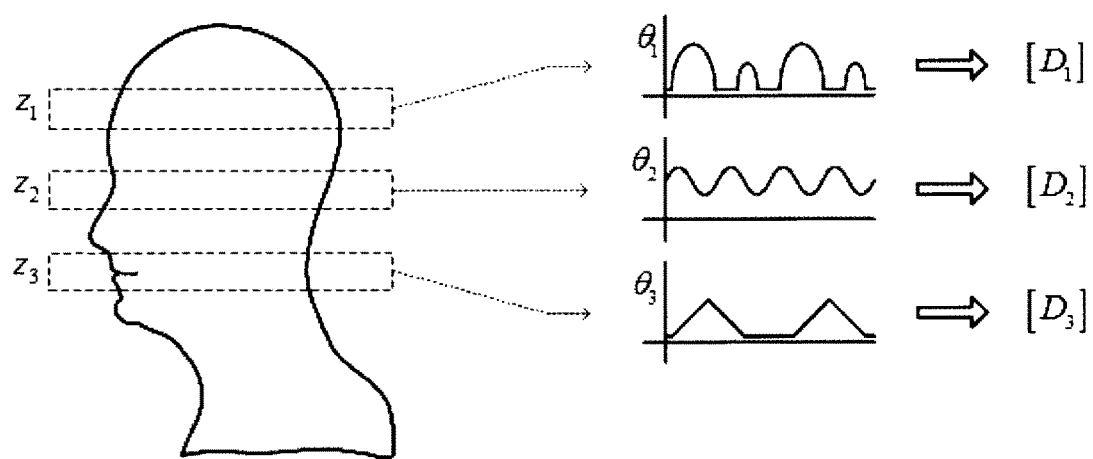
FIG. 1 illustrates an example of modulating spin magnetization in different simultaneously excited slices using unique flip angle trains for the different slices.

Example apparatus and methods perform magnetic resonance fingerprinting with simultaneous multivolume acquisition (MRF-SMVA). MRF-SMVA includes creating a first MRF excitation in a first volume (e.g., slice) of an object to produce a first signal evolution. MRF-SMVA also includes creating a second, different MRF excitation in a second different volume (e.g., slice) of the object to produce a second signal evolution. In one embodiment, the first and second MRF excitations are excited simultaneously. In another embodiment, the first and second MRF excitations may be produced sequentially. While two volumes are described, two or more volumes may be excited simultaneously. An MRF excitation is a nuclear magnetic resonance (NMR) excitation that produces signal evolutions whose signals include complex values having an arbitrary phase relationship. The first signal evolution and second signal evolution may be acquired simultaneously. With both signal evolutions available, magnetic resonance (MR) parameters (e.g., T1, T2, B0, proton density) may be determined simultaneously for portions of the two volumes. The first MRF excitation and the second MRF excitation may be designed to cause the first signal evolution and the second signal evolution to be correlated less than a threshold amount to facilitate disambiguating the received NMR signals.

Example apparatus and methods may produce a quantitative parameter map from NMR signals acquired from different volumes that experience different simultaneous NMR excitation during MRF. An MRI system may be directed to acquire data from a plurality of simultaneously excited slices in a subject during a plurality of data acquisition periods while modulating spin magnetization in at least one of the plurality of slices differently than in others of the plurality of slices. Quantitative parameters (e.g., T1, T2, B0, proton density) may be estimated by comparing the acquired signals with stored signals. A quantitative parameter map may be produced based on the estimated quantitative parameters. Images may be reconstructed from the acquired data.

MRF causes resonant species in an object to produce pseudorandom MR signal evolutions. The signal evolutions may include complex values having an arbitrary phase relationship. The pseudorandom signal evolutions may be compared to a dictionary of stored signal evolutions. The stored signal evolutions may be from previous acquisitions or may even be from theoretical models. For example, the stored signal evolutions can be from a set described by:

$$SE = \sum_{i=1}^{N_S} \prod_{i=1}^{N_A} \sum_{j=1}^{N_{RF}} R_{i(\alpha)} R_{RF_{ij}(\alpha,\phi)} R(G) E_i(T1, T2, \ldots) DPdM_0 \quad [1]$$

or $$SE = \sum_{i=1}^{N_S} \prod_{i=1}^{N_A} \sum_{j=1}^{N_{RF}} R_i(\alpha) R_{RF_{ij}(\alpha,\phi)} R(G) E_i(T1, T2, \ldots) DPdM_0 \quad [2]$$

where:

SE is a signal evolution, $N_S$ is a number of spins, $N_A$ is a number of sequence blocks, $N_{RF}$ is a number of RF pulses in a sequence block, $\alpha$ is a flip angle, $\phi$ is a phase angle, $R_i(\alpha)$ is a rotation due to off resonance, $R_{RF_{ij}}(\alpha,\phi)$ is a rotation due to RF differences, $R(G)$ is a rotation due to a gradient, T1 is spin-lattice relaxation, T2 is spin-spin relaxation, D is diffusion relaxation, Pd is proton density, $E_i$(T1, T2, ... ) is decay due to relaxation differences, and $M_0$ is the default or equilibrium magnetization. These signal evolutions include complex values with arbitrary phase relationships.

MRF simultaneously provides quantitative data concerning multiple MR parameters. Observed signal evolutions are matched to dictionary entries using, for example, template matching or other matching or comparing processes. In one example matching process, the inner product is computed between a noisy acquired signal and entries in a dictionary to find the stored signal evolution to which an acquired signal evolution most closely matches. In other examples, other pattern matching or similarity finding approaches are performed. Values related to the dictionary entry that matched the acquired noisy signal may then be retrieved. In one example, the values may be stored in the dictionary, while in another example MR parameters may be stored in a data store separate from the dictionary. In one embodiment, the values may be retrieved by performing a mathematical operation on a signal evolution.

In one embodiment, MRF is performed using a simultaneous multi-slice (SMS) data acquisition scheme. In one embodiment, a two-dimensional MRF acquisition may be accelerated using an appropriate SMS imaging technique in which data from multiple different slices are simultaneously acquired. Conventionally, data may have been acquired from one slice at a time. The data from the multiple different slices may then be matched simultaneously to different stored signal evolutions.

MRF uses a data acquisition scheme that causes signals from different materials or tissues to be spatially and temporally incoherent. The signals are incoherent because acquisition parameters are varied throughout the data acquisition process. To accelerate data acquisitions associated with MRF, example systems and methods use various different multivolume techniques that provide additional spatial and temporal incoherence by modulating spin magnetization in a plurality of simultaneously excited volumes. The spin magnetization may be modulated in different volumes to reduce the correlation between dictionary signal evolutions associated with the volumes. Modulating spin magnetization facilitates accurate parameter estimation for the different simultaneously acquired volumes. Spin magnetization may be modulated by varying acquisition parameters including flip angle, RF pulse phase, RF pulse magnitude, gradients applied, echo time, sampling patterns, and other parameters. Sampling patterns may be varied by, for example, modifying readout encoding gradients. The acquisition parameters may be varied in a pseudorandom manner. As a result of the spatial and temporal incoherence imparted by the acquisition scheme, materials or tissue are associated with a unique signal evolution or "fingerprint" that is a function of multiple different physical MR parameters.

From all the acquisition parameters that can be varied, flip angles provide one readily diagrammed and understood example. In one embodiment, spin magnetization in simultaneously excited volumes can be modulated by using different flip angle trains for different volumes. Different flip angle trains can be produced in different acquisition periods by modifying the flip angle of the RF excitation pulse for a particular volume relative to other volumes. Different flip angle trains may also be produced by modifying the phase or magnitude of the RF excitation pulse for a particular volume relative to other volumes. Different flip angle trains may also be produced by modifying combinations of the flip angle, the flip angle magnitude, and the flip angle phase of the RF excitation pulse. The variations may be made continuously during successive acquisition periods.

Having different spin modulation for different volumes results in different time series signatures or signal evolutions for the different volumes. Since the time signatures are different, different dictionary entries may be matched for the simultaneously acquired signal evolutions. In one embodiment, the NMR excitation for the different volumes is designed so that the resulting time signatures are more easily separable. Being more separable may be facilitated by producing time signatures that are as highly uncorrelated as possible. In one embodiment, the resulting time signals from the differently excited volumes may be acquired as a mixed signal. The mixed signal may then be matched to a dictionary of stored signals to retrieve MR parameters. In one embodiment, the mixed signal may be separated into different signals that are then individually matched against the dictionary.

FIG. 1 illustrates three different slices z1, z2, z3 that experience different flip angle trains θ1, θ2, θ3 in response to three different NMR excitations. The different slices z1, z2, z3 then produce different time signatures or signal evolutions D1, D2, and D3. In one embodiment, the flip angle trains may be designed to improve the ability to un-alias collapsed data from the simultaneously excited slices.

In one embodiment, spin magnetization in simultaneously excited volumes may be modulated by creating phase differences that will be revealed in the signals obtained from simultaneously acquired signal evolutions. Phase differences can be created by, for example, introducing a gradient blip. In one embodiment the gradient blip may be applied in the slice-encoding direction (e.g., $G_z$). The gradient blip may be applied prior to the data acquisition period and then the resulting phase difference may be rewound prior to the next acquisition period. The phase difference may be rewound by playing out a gradient blip with opposite polarity and the same magnitude or integral value.

Figure 2:
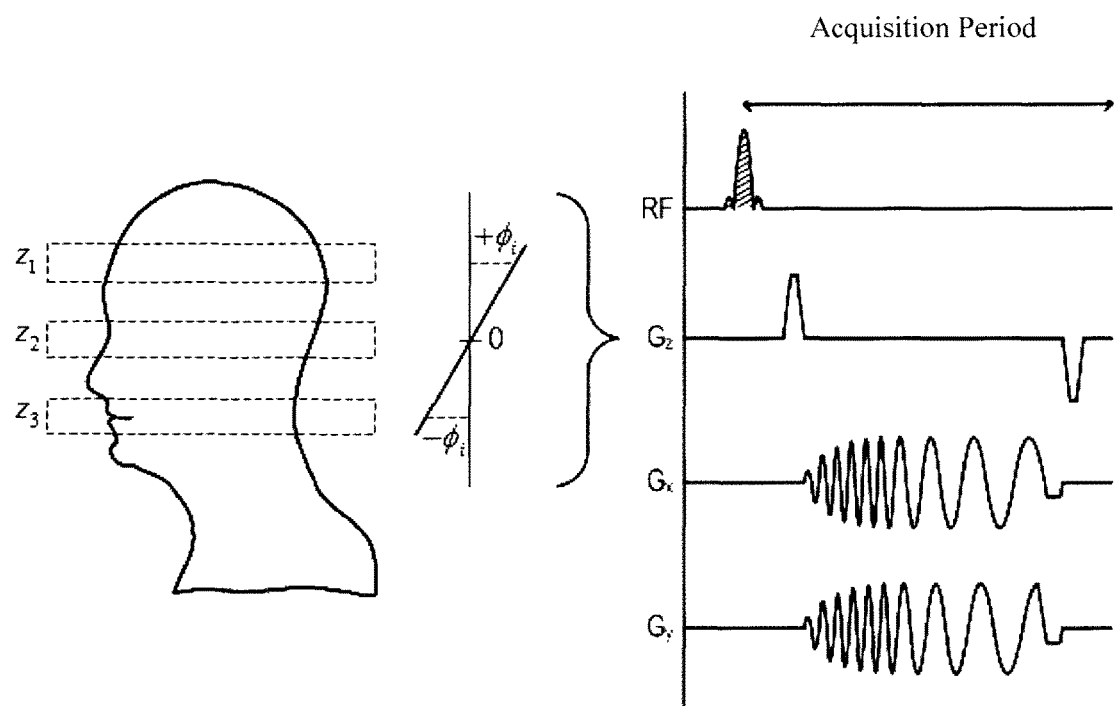
FIG. 2 illustrates an example of modulating spin magnetization in different simultaneously excited slices using slice encoding gradients to impart a phase difference between the different slices.

FIG. 2 illustrates an example gradient blipping approach. The example gradient blipping technique produces distinct phases for simultaneously acquired signal evolutions, which may produce a phase variation from one acquisition to the next acquisition, which may in turn facilitate separating the acquired signals.

In one example, a train of gradient blips for two simultaneously excited slices may be described by:

TABLE 1

|  | $\Delta\varphi$, $TR_1$ | $\Delta\varphi$, $TR_2$ | $\Delta\varphi$, $TR_3$ | $\Delta\varphi$, $TR_4$ | ... | $\Delta\varphi$, $TR_{N-1}$ | $\Delta\varphi$, $TR_N$ |
|---|---|---|---|---|---|---|---|
| Slice 1 | 0 | π | 0 | π | ... | 0 | π |
| Slice 2 | 0 | 0 | 0 | 0 | ... | 0 | 0 |

In another embodiment, different NMR excitations may produce different spin magnetization in simultaneously excited volumes by manipulating slice-encoding gradients during the data acquisition period. The slice-encoding gradients may be manipulated to shift signals acquired from different volumes to make the signals more separable.

Figure 3:
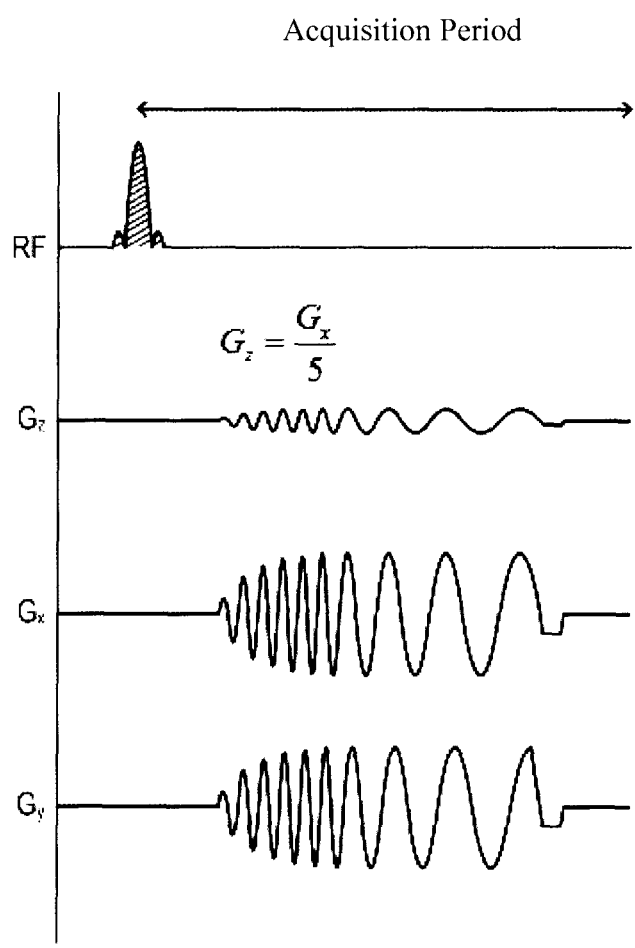
FIG. 3 illustrates an example of modulating spin magnetization in different simultaneously excited slices using a slice-encoding gradient to impart different spatial shifts.

FIG. 3 illustrates one example slice-encoding gradient scheme. In one embodiment, the slice-encoding gradient applied during the data acquisition period may be varied in different acquisition periods to match the $G_x$ and $G_y$ gradients. In one example, the $G_z$ gradient can be selected as, $$G_z = \frac{G_x}{5}$$

In other examples, the $G_z$ gradient may be selected from choices including, but not limited to:

$$G_z = \frac{G_x}{10},$$

$$G_z = -\frac{G_x}{10},$$

$$G_z = \frac{G_y}{10},$$

$$G_z = -\frac{G_y}{5},$$

$$G_z = \frac{(G_x + G_y)}{10},$$

or $$G_z = \frac{\left(G_x + \frac{1}{2}G_y\right)}{5}$$

Using an example gradient encoding scheme may cause simultaneously acquired data to be collapsed with a spatial shift that varies in direction and magnitude from one acquisition period to the next.

Figure 4:
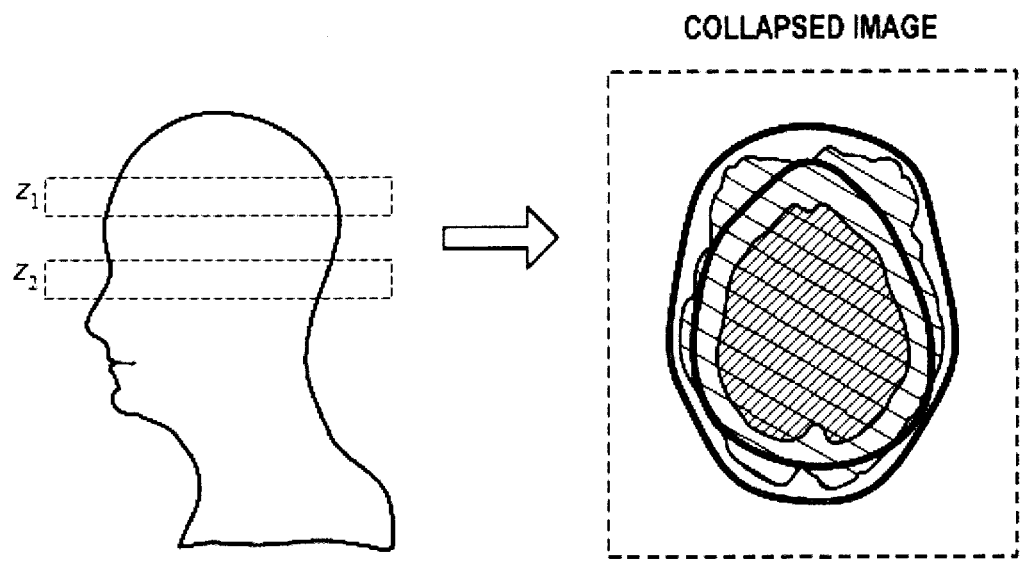
FIG. 4 illustrates example collapsed images that have not been shifted.

FIG. 4 illustrates simulated images reconstructed from data simultaneously acquired from two different volumes that were acquired without a $G_z$ gradient played out during data acquisition. The images appear be collapsed on top of each other.

Figure 5:
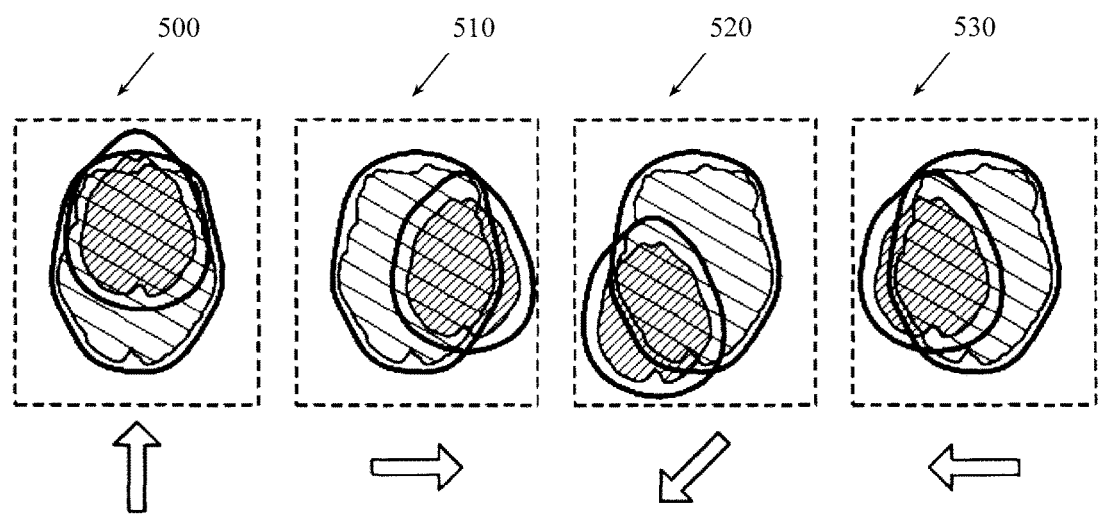
FIG. 5 illustrates example collapsed images being spatially shifted in different directions, magnitudes, or both, in successive acquisition periods.

FIG. 5 illustrates simulated images reconstructed from data acquired simultaneously from two different volumes when a $G_z$ gradient is played out during the data acquisition period. The different images 500, 510, 520, and 530 are associated with different acquisition periods. Comparing FIG. 5 to FIG. 4 reveals that the collapsed images are shifted relative to each other. By varying the $G_z$ gradient from one acquisition period to the next, the spatial shift is varied as a function of the acquisition period. This variation in the spatial shift between the volumes creates a spatial-temporal incoherency between the signals from the multiple volumes. This spatial-temporal incoherency facilitates separating or disambiguating the signals which may in turn facilitate matching signals in the dictionary.

Figure 6:
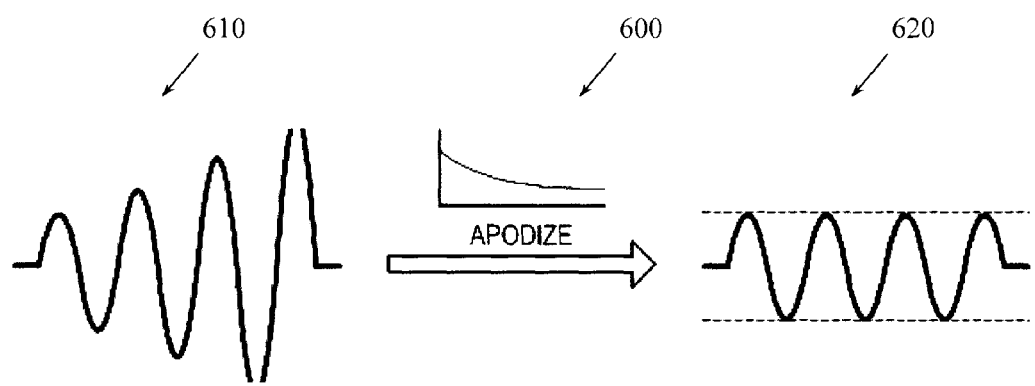
FIG. 6 illustrates an example of manipulating a slice-encoding gradient.

To limit intravoxel dephasing along the slice-encoding direction from the additional $G_z$ waveform, which might cause signal loss, the amplitude of the integral of the $G_z$ waveform at a point along the readout period can be limited or otherwise controlled. FIG. 6 illustrates applying this type of restriction to a $G_z$ waveform 610. In one embodiment, the restriction may be applied in a manner that is equivalent to multiplying the $G_z$ waveform by an apodizing function. An input waveform 610 is manipulated into an output waveform 620 by an apodizing function 600. Other functions may be employed to manipulate the input waveform 610 into an output waveform 620.

Figure 7:
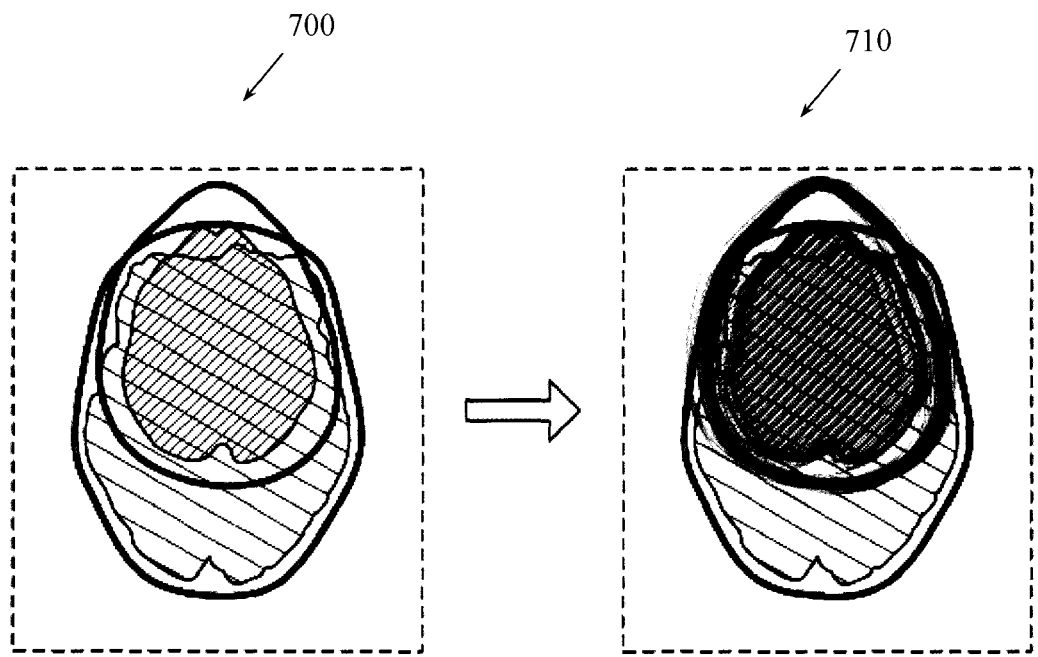
FIG. 7 illustrates example shifting and blurring that is induced by applying a slice-encoding gradient that does not match readout gradients during data acquisition.

FIG. 7 illustrates a result of restricting the $G_z$ waveform to not match the $G_x$ and $G_y$ waveforms. The mismatch may induce a blurring in collapsed images in addition to the shift. An original simulated image 700 may be blurred and appear as simulated image 710. The blurring may be removed during reconstruction of a slice at position $z_s$, according to:

$$\hat{S}(t) = S(t) \times e^{-i\gamma \int_0^T G(t) dt \cdot z_s}$$

where $\hat{S}(t)$ is the de-blurred signal, $S(t)$ is the collapsed signal, $\gamma$ is the gyromagnetic ratio, and $G(t)$ is the slice-encoding gradient waveform that was played out during the data acquisition. Other de-blurring processes may be employed. Performing de-blurring prior to signal matching facilitates using $G_z$ waveforms that do not necessarily resemble the $G_x$ and $G_y$ waveforms of the readout. More generally, $G_z$ waveforms can be used regardless of whether the waveform results in a spatial shift, spatial blurring, or other spatial distortions. $G_z$ waveforms may be selected with consideration of the potential effects they may have on through-slice dephasing. For example, the Gz waveform may be selected so as not to cause large through-slice phase accumulations that would result in significant through-slice dephasing and signal attenuation. In one embodiment, the Gz gradient may be used during acquisition to traverse a 3D k-space (e.g., perform some spatial encoding along z axis).

Example apparatus and methods may use parallel imaging reconstruction to un-alias signals from simultaneously excited slices. Parallel imaging reconstruction may depend on receive coil sensitivities. K-space based parallel imaging methods including generalized auto-calibrating partially parallel acquisition (GRAPPA) and slice-GRAPPA facilitate un-aliasing voxels in one spatial dimension at a time.

Figure 8:
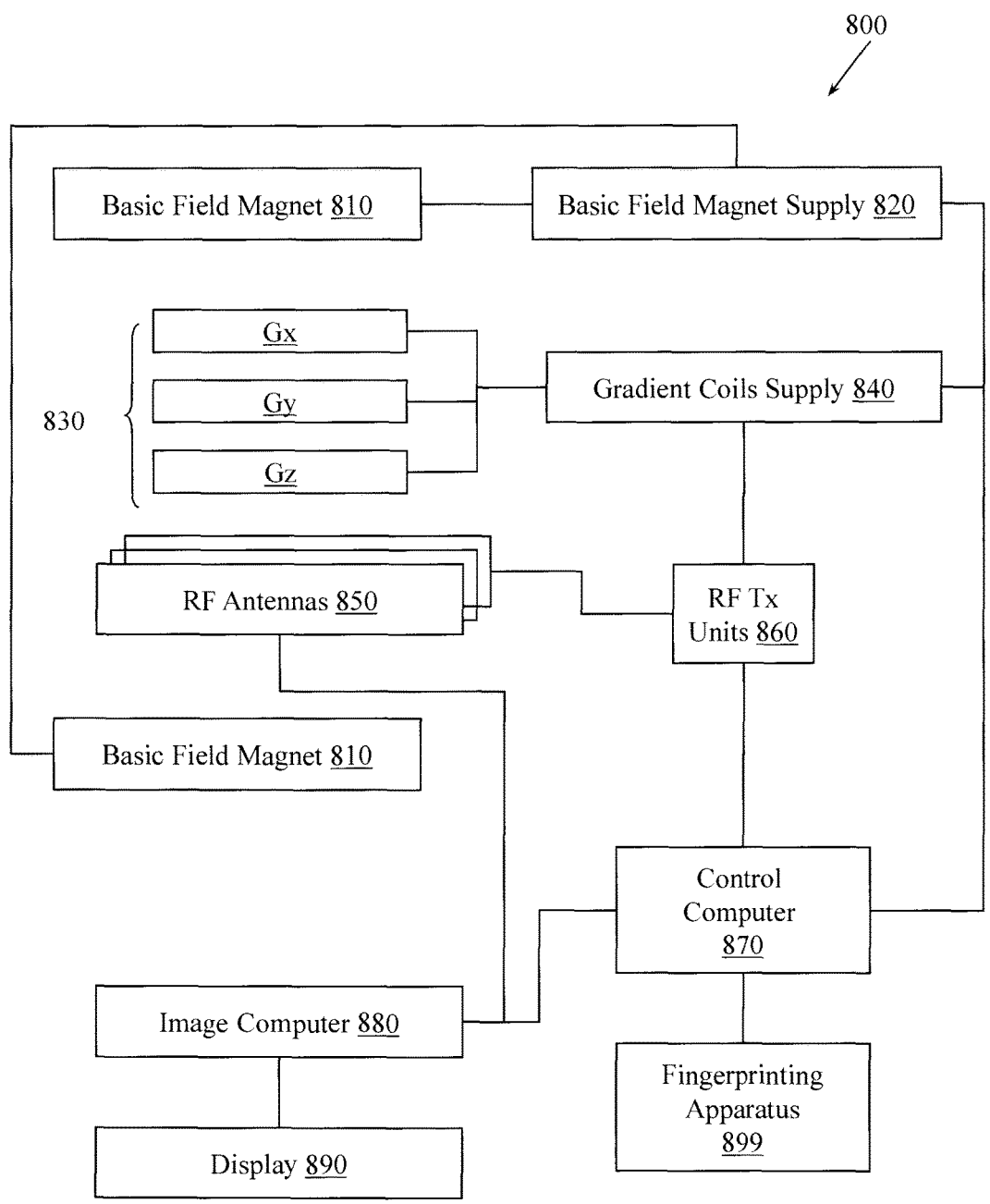
FIG. 8 illustrates an example apparatus associated with magnetic resonance fingerprint with simultaneous multivolume acquisition (MRF-SMVA).

FIG. 8 illustrates an example MR apparatus 800 having a fingerprinting apparatus 899 that facilitates MRF-SMVA. The fingerprinting apparatus 899 may be configured with elements of example apparatus described herein or may perform example methods described herein. While fingerprinting apparatus 899 is illustrated as part of MR apparatus 800, in one example, fingerprinting apparatus 899 may be a separate apparatus or apparatuses.

In one embodiment, fingerprinting apparatus 899 may include a collection logic that collects received signal evolutions from multiple volumes experiencing different NMR in response to different MRF excitations applied to the volumes by the MRI apparatus 800. Fingerprinting apparatus 899 may also include a data store that stores a dictionary of MRF signal evolutions. The fingerprinting apparatus 899 may also include a selection logic that selects members of the dictionary that are most closely related to the collected signal evolutions. Fingerprinting apparatus 899 may also include a characterization logic that identifies a category for tissues in the volumes based, at least in part, on the matching signal evolutions. The characterization logic may identify the category for the tissues in the volumes using a quantitative magnetic resonance based approach. The category for the tissues may distinguish healthy tissue from diseased tissue.

The apparatus 800 includes a basic field magnet(s) 810 and a basic field magnet supply 820. Ideally, the basic field magnets 810 would produce a uniform B0 field. However, in practice, the B0 field may not be uniform, and may vary over an object being analyzed by the MR apparatus 800. MR apparatus 800 may include gradient coils 830 that emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and that receive resulting NMR signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the MR signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

Fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available.

While FIG. 8 illustrates an example MR apparatus 800 that includes various components connected in various ways, it is to be appreciated that other MR apparatus may include other components connected in other ways.

Figure 9:
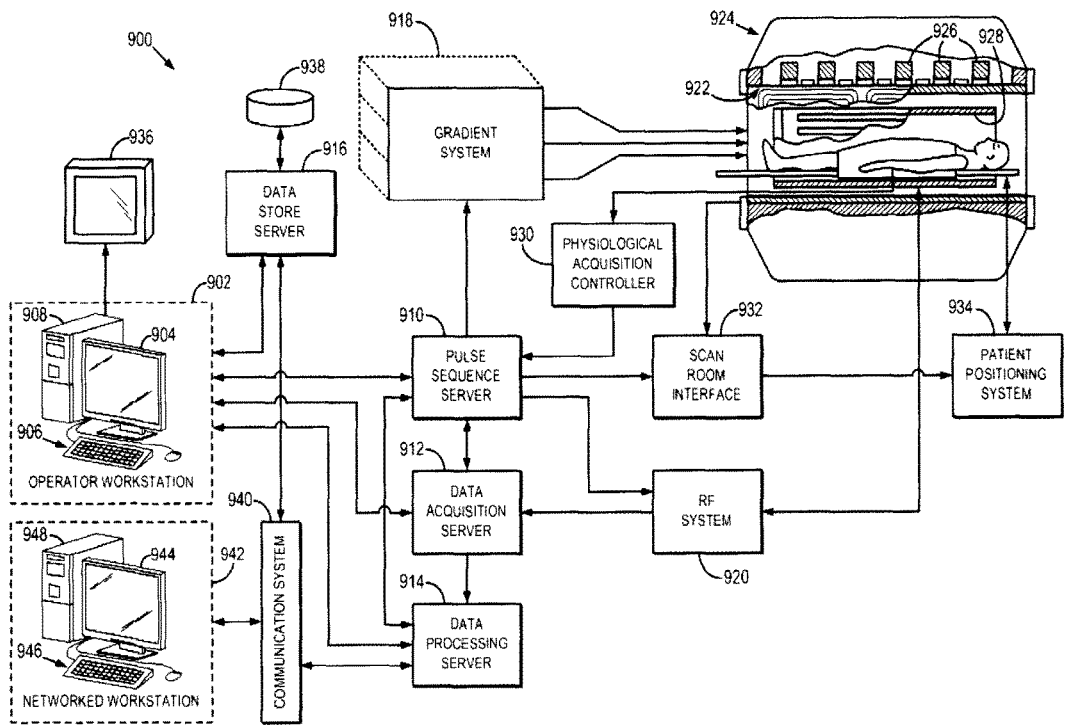
FIG. 9 illustrates an example apparatus associated with MRF-SMVA.

FIG. 9 illustrates another example MRI system 900 that performs MRF-SMVA. The MRI system 900 includes an operator workstation 902 that may include a display 904, one or more input devices 906 (e.g., keyboard, mouse), and a processor 908. The processor 908 may include a commercially available programmable machine running a commercially available operating system. The operator workstation 902 provides an operator interface that facilitates entering scan parameters into the MRI system 900. The operator workstation 902 may be coupled to different servers including, for example, a pulse sequence server 910, a data acquisition server 912, a data processing server 914, and a data store server 916. The servers 910, 912, 914, and 916 may be connected via a communication system 940 that may include wired or wireless network connections.

The pulse sequence server 910 functions in response to instructions provided from the operator workstation 902 to operate a gradient system 918 and an RF system 920. Gradient waveforms for performing a desired scan are produced and applied to the gradient system 918, which then excites gradient coils in an assembly 922 to produce the magnetic field gradients Gx, Gy, and Gz that are used for encoding magnetic resonance signals. The gradient coil assembly 922 forms part of a magnet assembly 924 that includes a polarizing magnet 926 and a whole-body RF coil 928.

RF waveforms are applied by the RF system 920 to the RF coil 928, or a separate local coil to perform the desired MR pulse sequence. Responsive MR signals detected by the RF coil 928, or a separate local coil are received by the RF system 920. The responsive MR signals may be amplified, demodulated, filtered, and digitized under direction of commands produced by the pulse sequence server 910. The RF system 920 includes an RF transmitter for producing a wide variety of RF pulses used in MRI pulse sequences. The RF transmitter is responsive to the desired scan and direction from the pulse sequence server 910 to produce RF pulses of a desired frequency, phase, and pulse amplitude waveform. The generated RF pulses may be applied to the whole-body RF coil 928 or to one or more local coils or coil arrays.

The RF system 920 also includes one or more RF receiver channels.

RF receiver channels include an RF preamplifier that amplifies the MR signal received by the coil 928 to which it is connected, and a detector that detects and digitizes the I and Q quadrature components of the received MR signal. The magnitude of the received MR signal may, therefore, be determined at a sampled point by the square root of the sum of the squares of the I and Q components:

$$M=\sqrt{I^2+Q^2}$$

and the phase of the received MR signal may be determined according to:

$$\varphi = \tan^{-1}\left(\frac{Q}{I}\right)$$

The pulse sequence server 910 may receive patient data from a physiological acquisition controller 930. By way of example, the physiological acquisition controller 930 may receive signals from a number of different sensors connected to the patient including electrocardiograph (ECG) signals from electrodes, or respiratory signals from a respiratory bellows or other respiratory monitoring devices. These signals may be used by the pulse sequence server 910 to synchronize, or "gate," the performance of the scan with the subject's heart beat or respiration.

The pulse sequence server 910 may also connect to a scan room interface circuit 932 that receives signals from various sensors associated with the condition of the patient and the magnet system. Through the scan room interface circuit 932, a patient positioning system 934 receives commands to move the patient to desired positions during the scan.

The digitized MR signal samples produced by the RF system 920 are received by the data acquisition server 912. The data acquisition server 912 operates in response to instructions downloaded from the operator workstation 902 to receive the real-time MR data and to provide buffer storage so that data is not lost by data overrun. In some scans, the data acquisition server 912 passes the acquired MR data to the data processor server 914. In scans that require information derived from acquired MR data to control the further performance of the scan, the data acquisition server 912 may be programmed to produce such information and convey it to the pulse sequence server 910. For example, during pre-scans, MR data is acquired and used to calibrate the pulse sequence performed by the pulse sequence server 910. As another example, navigator signals may be acquired and used to adjust the operating parameters of the RF system 920 or the gradient system 918, or to control the view order in which k-space is sampled. In still another example, the data acquisition server 912 may also process MR signals used to detect the arrival of a contrast agent in an MR angiography (MRA) scan. For example, the data acquisition server 912 may acquire MR data and processes it in real-time to produce information that is used to control the scan.

The data processing server 914 receives MR data from the data acquisition server 912 and processes the MR data in accordance with instructions downloaded from the operator workstation 902. Such processing may include, for example, reconstructing two-dimensional or three-dimensional images by performing a Fourier transformation of raw k-space data, performing other image reconstruction algorithms (e.g., iterative or back projection reconstruction algorithms), applying filters to raw k-space data or to reconstructed images, generating functional magnetic resonance images, or calculating motion or flow images.

Images reconstructed by the data processing server 914 are conveyed back to the operator workstation 902 for storage. Real-time images may be stored in a data base memory cache from which they may be output to operator display 912 or a display 936. Batch mode images or selected real time images may be stored in a host database on disc storage 938. When such images have been reconstructed and transferred to storage, the data processing server 914 may notify the data store server 916 on the operator workstation 902. The operator workstation 902 may be used by an operator to archive the images, produce films, or send the images via a network to other facilities.

The MRI system 900 may also include one or more networked workstations 942. For example, a networked workstation 942 may include a display 944, one or more input devices 946 (e.g., keyboard, mouse), and a processor 948. The networked workstation 942 may be located within the same facility as the operator workstation 902, or in a different facility, such as a different healthcare institution or clinic.

The networked workstation 942 may gain remote access to the data processing server 914 or data store server 916 via the communication system 940. Accordingly, multiple networked workstations 942 may have access to the data processing server 914 and the data store server 916. In this manner, MR data, reconstructed images, or other data may be exchanged between the data processing server 914 or the data store server 916 and the networked workstations 942, such that the data or images may be remotely processed by a networked workstation 942.

Figure 10:
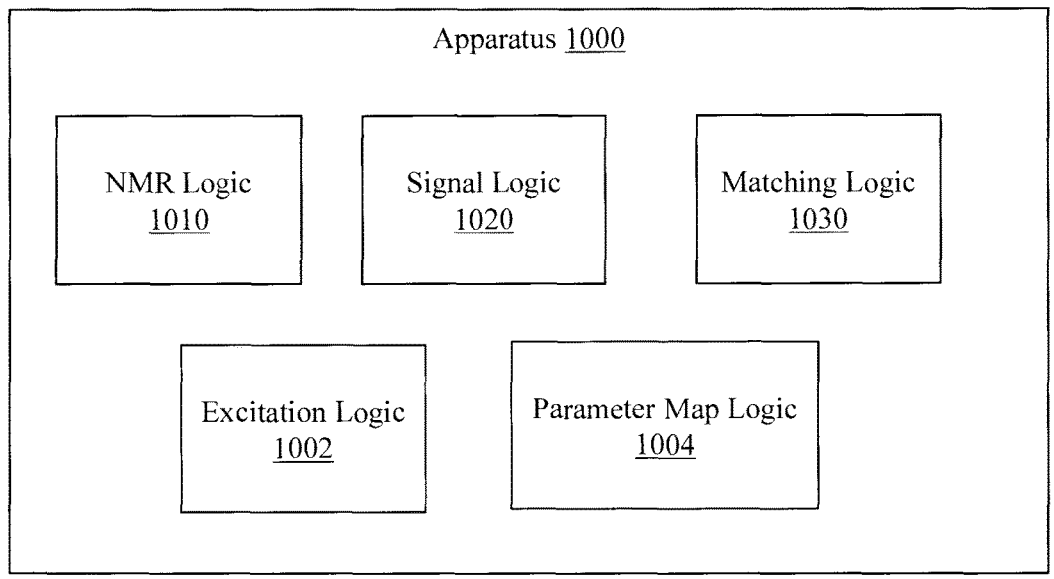
FIG. 10 illustrates an example apparatus associated with MRF-SMVA.

FIG. 10 illustrates an apparatus 1000. Apparatus 1000 may control an MRI apparatus to perform MRF-SMVA. Apparatus 1000 includes an excitation logic 1002 that causes an MRF apparatus to create different MRF excitations in a plurality of different slices in an object. Excitation logic 1002 causes the different MRF excitations to be active at the same time. The excitation logic 1002 causes the MRF apparatus to apply RF energy and gradients to the object according to an MRF pulse sequence to cause the object to produce the NMR signals. In one embodiment, the excitation logic 1002 applies RF energy to different volumes (e.g., slices) in an object according to different MRF pulse sequences that produce different NMR excitations in the different volumes.

In one embodiment, the MRF pulse sequences produce flip angle trains having different numbers, phases, or magnitudes in two or more members of the plurality of different slices. In one embodiment, the MRF pulse sequence causes different gradients to be applied to two or more members of the plurality of different slices before, during, or after receiving the first set of data. The different gradients may be configured to cause a phase shift between the two or more members of the plurality of slices, to spatially shift two or more members of the plurality of slices relative to each other in an image field-of-view, to produce spatial blurring in at least one member of the plurality of slices, or to produce a spatial distortion in at least one member of the plurality of slices.

In different embodiments, the MRF pulse sequence may be a Fast-Imaging with Steady-state Precession FISP-MRF pulse sequence, an inversion recovery FISP (IR TrueFISP) pulse sequence, or a balanced steady state free precession (bSSFP) MRF pulse sequence.

Apparatus 1000 includes an NMR logic 1010. NMR logic 1010 repetitively and variably samples the slices in the object in a (k, t, E) space to acquire sets of data. The sets of data may be sets of NMR signals that may have non-constant amplitude and/or phase. Members of the sets of NMR signals are associated with different points in the (k, t, E) space, where t is time and E includes at least T1 and T2, T1 being spin-lattice relaxation and T2 being spin-spin relaxation, and where one or more of, t and E, vary non-linearly. In different embodiments the different points are sampled according to a plan where t and/or E varies non-linearly and/or in a non-constant manner. The first set of data includes signals from the plurality of slices.

In different embodiments, the E in the (k, t, E) space includes two or more parameters selected from the group including: echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, an amount of gradient spoiling, an amount of time between sequence blocks in a series of variable sequence blocks, the relative amplitude of RF pulses in sequence blocks in a series of variable sequence blocks, and the relative phase of RF pulses in sequence blocks in a series of variable sequence blocks.

Apparatus 1000 also includes a signal logic 1020. Signal logic 1020 produces one or more NMR signal evolutions from the acquired NMR signals. The signal evolutions may include a number of NMR signals acquired over a period of time. The signal evolutions may have contributions from the different volumes and from different resonant species. Different amounts of resonant species in a sample may cause different signal evolutions to be produced. For example, a first sample that is 70% water and 30% fat may produce a first signal evolution while a second sample that is 30% water and 70% fat may produce a second, different signal evolution even though the same two resonant species are present in the samples.

Apparatus 1000 also includes a matching logic 1030. Matching logic 1030 compares the produced NMR signal evolutions or information associated with the produced NMR signal evolutions to a collection (e.g., dictionary, database) of stored signal evolutions to find matches for the acquired NMR signal evolutions. Matching logic 1030 selects, from a collection of stored signal evolutions, one or more selected stored signal evolutions that match one or more members of the one or more NMR signal evolutions to within a desired tolerance.

"Match" as used herein refers to the result of comparing signals. "Match" does not refer to an exact match, which may or may not be found. A match may be the signal that most closely resembles another signal. A match may be the first signal that matches another signal to within a threshold. A match may be found by template matching, pattern matching, model fitting, or other comparison approaches. The reference information may be, for example, a previously acquired signal evolution, a simulated signal evolution, an item derived from a signal evolution other than the produced NMR signal evolution, and other information. The reference information may include signal evolutions from different tissue types (e.g., healthy, diseased, advanced disease). The reference information may include signal evolutions that are formed from combinations of resonant species with combinations of MR parameters.

The collection of stored signal evolutions may include a signal selected from those described by equations 1 or 2. The collection of stored signal evolutions may also include a signal selected from:

$$S_i = R_i E_i (S_{i-1}) \qquad [3]$$

or $$S_i = R_i E_i \sum_{x=1}^{i-1} R_x E_x (S_x) \qquad [4]$$

or $$S_i = R_i E_i \prod_{x=1}^{i-1} R_x E_x (S_x) \qquad [5]$$

or $$S_i = \sum_{s=1}^{N_s} R_{s,i} E_{s,i} (S_{s,i-1}) \qquad [6]$$

or $$S_i = \sum_{s=1}^{N_s} R_{s,i} E_{s,i} \sum_{x=1}^{i-1} R_{s,x} E_{s,x}(S_{s,x})$$ [7]

or $$S_i = \sum_{s=1}^{N_s} R_{s,i} E_{s,i} \prod_{x=1}^{i-1} R_{s,x} E_{s,x}(S_{s,x})$$ [8]

where:

$S_0$ is the default or equilibrium magnetization, $S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i. Equations 1-8 may be referred to in the specification and in the claims as the "MRF dictionary signal equations."

Apparatus 1000 also includes a parameter map logic 1004 that simultaneously produces parameter maps or images for members of the plurality of slices. The parameter maps or images are built from the one or more selected stored signal evolutions.

In one embodiment, the excitation logic 1002 causes the MRF apparatus to create a standalone MRF excitation in a member of the plurality of different slices. The standalone MRF excitation will not be active at the same time as the different MRF excitations in the plurality of different slices. The NMR logic 1010 receives a second set of data from the MRF apparatus in response to the MRF apparatus repetitively and variably sampling the (k, t, E) space associated with standalone MRF excitation to acquire the second set of NMR signals. The second set of data includes signals from the member of the plurality of different slices that is experiencing the standalone MRF excitation. The signal logic 1020 then produces a standalone NMR signal evolution from the second set of data. The matching logic 1030 may then perform some matching and acquire some MR parameters using a signal evolution associated with the standalone MRF excitation. The signal logic 1020 may also perform some matching and acquire some MR parameters based on the signal evolutions associated with the simultaneous MRF excitations.

Figure 11:
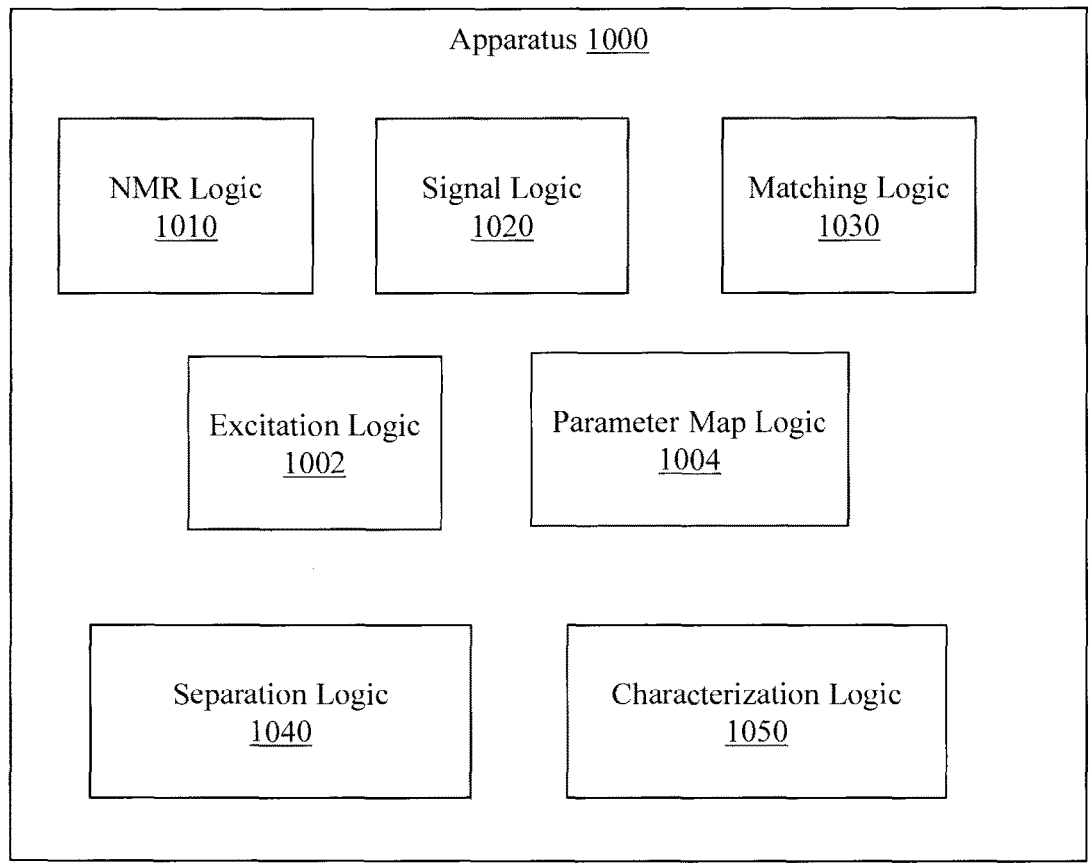
FIG. 11 illustrates an example apparatus associated with MRF-SMVA.

FIG. 11 illustrates another embodiment of apparatus 1000. This embodiment of apparatus 1000 also includes a separation logic 1040. Separation logic 1040 may separate the one or more NMR signal evolutions from the first set of data by performing a generalized auto-calibrating partially parallel acquisition (GRAPPA) operation on the first set of data. Additionally or alternatively, separation logic 1040 may separate the one or more NMR signal evolutions by performing a slice generalized auto-calibrating partially parallel acquisition (slice-GRAPPA) operation on the first set of data. Additionally or alternatively, separation logic 1040 may separate the one or more NMR signal evolutions by performing a generalized auto-calibrating parallel acquisition (GRAPPA) operator (GROG) slice operation on the first set of data.

MRF apparatus 1000 also includes a characterization logic 1050 that identifies the object as having a property based, at least in part, on the plurality of parameter maps. The property may describe, for example, whether the object is a diseased tissue or a healthy tissue.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 12:
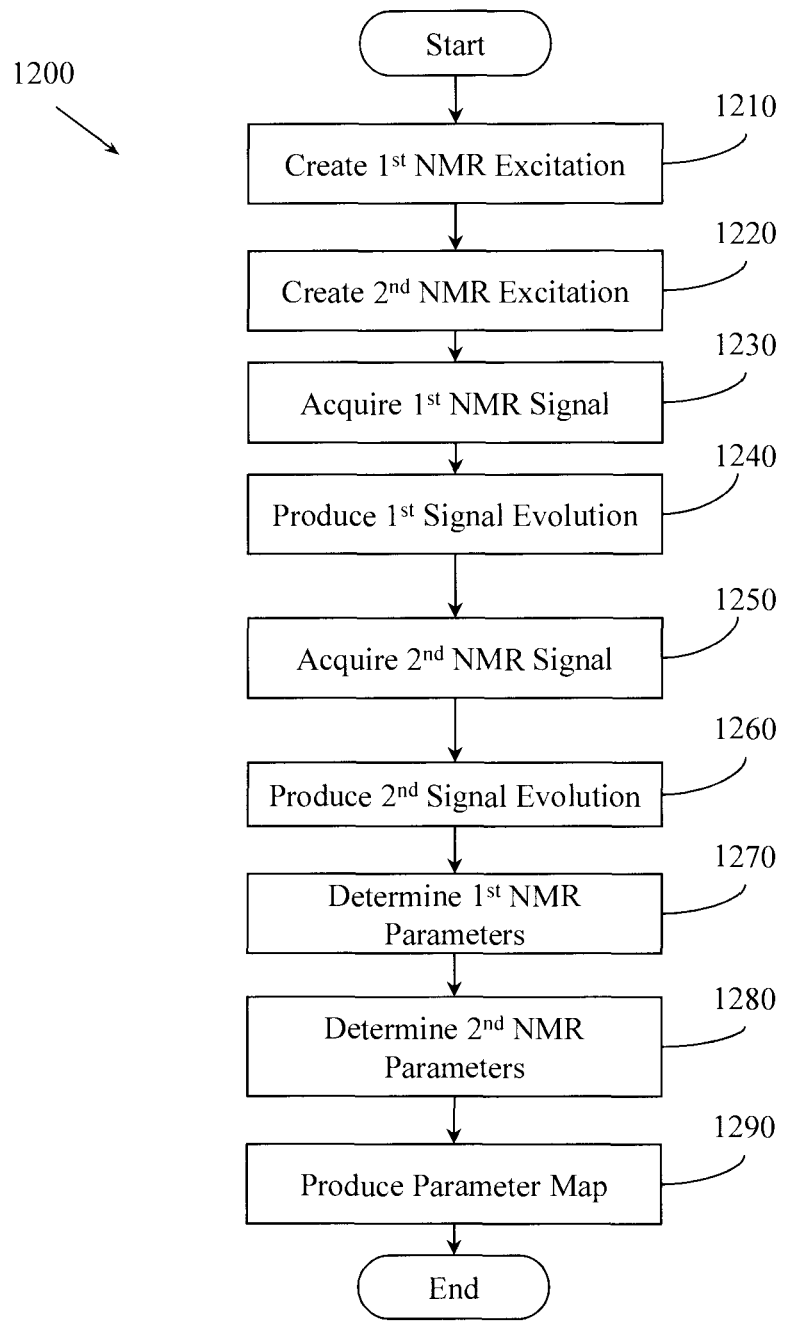
FIG. 12 illustrates an example method associated with MRF-SMVA.

FIG. 12 illustrates a method 1200 associated with MRF-MVSA. Method 1200 creates a parameter map or an image from data acquired by controlling an MRI apparatus to perform MRF-SMVA. Method 1200 includes, at 1210 controlling the MRI apparatus to create a first NMR excitation in a first volume in a sample according to a first set of MRF parameters. Creating the first NMR excitation may include applying gradients and RF energy to the first volume in a first series of variable sequence blocks. A member of the first series of variable sequence blocks includes one or more excitation phases, one or more readout phases, and one or more waiting phases. The gradients and RF energy applied during a member of the first series of variable sequence blocks causes the resonant species in the first volume to simultaneously produce individual NMR signals. A member of the first series of variable sequence blocks differs from at least one other member of the first series of variable sequence blocks in at least N sequence block parameters, N being an integer greater than one.

Method 1200 also includes, at 1220, controlling the MRI apparatus to create a second, different NMR excitation in a second volume in the sample according to a second set of MRF parameters. Creating the second NMR excitation may include applying gradients and RF energy to the second volume in a second series of variable sequence blocks. A member of the second series of variable sequence blocks includes one or more excitation phases, one or more readout phases, and one or more waiting phases. The gradients and RF energy applied during a member of the second series of variable sequence blocks causes the resonant species in the second volume to simultaneously produce individual NMR signals. At least one member of the second series of variable sequence blocks differs from at least one other member of the second series of variable sequence blocks in at least M sequence block parameters, M being an integer greater than one. The first series of variable sequence blocks differs from the second series of variable sequence blocks.

The sequence block parameters may include echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, or an amount of gradient spoiling. The MRI apparatus may also vary an amount of time between sequence blocks in a series of variable sequence blocks, may vary the relative amplitude of RF pulses in sequence blocks in a series of variable sequence blocks, or may vary the relative phase of RF pulses in sequence blocks in a series of variable sequence blocks.

The first NMR excitation and the second NMR excitation are active simultaneously. In one embodiment, the first set of MRF parameters and the second set of MRF parameters are selected to cause the first signal evolution and the second signal evolution to be correlated less than a threshold amount. Additionally, or alternatively, the first set of MRF parameters and the second set of MRF parameters are selected to produce a different flip angle train in the first NMR excitation and the second NMR excitation, to produce different phases in a flip angle train in the first NMR excitation and the second NMR excitation, or to produce different magnitudes in a flip angle train in the first NMR excitation and the second NMR excitation.

In one embodiment, the MRI apparatus produces the first NMR excitation and the second NMR excitation according to a Fast-Imaging with Steady-state Precession FISP-MRF pulse sequence or an inversion recovery FISP (IR TrueFISP) pulse sequence. In one embodiment, the MRI apparatus produces the first NMR excitation and the second NMR excitation according to a balanced steady state free precession (bSSFP) MRF pulse sequence.

Method 1200 also includes, at 1230, controlling the MRI apparatus to acquire first NMR signals produced by the first volume in response to the first NMR excitation. Method 1200 also includes, at 1240, producing a first signal evolution from the first NMR signals, the first signal evolution having complex values with an arbitrary phase relationship.

Method 1200 also includes, at 1250, controlling the MRI apparatus to acquire second NMR signals produced by the second volume in response to the second NMR excitation. The first NMR signals and the second NMR signals may be acquired using different sampling patterns. In one embodiment, the first NMR signals and the second NMR signals using a slice direction sensitivity encoding (SENSE) approach. Method 1200 also includes, at 1260, producing a second signal evolution from the second NMR signals. The second signal evolution has complex values with an arbitrary phase relationship.

In one embodiment, the first NMR signals and the second NMR signals are acquired simultaneously. In one embodiment, the first NMR signals and the second NMR signals are acquired simultaneously as discrete signals. In this embodiment, the first signal evolution and the second signal evolution may be compared to known signal evolutions independently. In one embodiment, the first NMR signals and the second NMR signals are acquired simultaneously as a mixed signal. In this embodiment, the first signal evolution and the second signal evolution are combined as a mixed signal evolution. In this embodiment, the mixed signal evolution may be compared to the known signal evolutions.

In one embodiment, the mixed signal may be separated into the first signal evolution and the second signal evolution before determining the quantitative MR parameters for the first volume and before determining the quantitative MR parameters for the second volume. The mixed signal may be separated by performing a GRAPPA operation on the mixed signal, by performing a slice-GRAPPA operation on the mixed signal, by performing a GROG-slice operation on the mixed signal, or in other ways.

Method 1200 also includes, at 1270, simultaneously determining two or more first quantitative MR parameters for a portion of the first volume based on a comparison of the first signal evolution to known signal evolutions. Method 1200 also includes, at 1280, simultaneously determining two or more second quantitative MR parameters for a portion of the second volume based on a comparison of the second signal evolution to known signal evolutions. The known signal evolutions may include a signal selected from a set of signals described by the MRF dictionary signal equations.

Method 1200 also includes, at 1290, producing the parameter map or the image based, at least in part, on the two or more first quantitative MR parameters or the two or more second quantitative parameters. The quantitative MR parameters may include T1, T2, M0, and proton density, T1 being spin-lattice relaxation, T2 being spin-spin relaxation, M0 being initial magnetization.

In one embodiment, the first volume is a slice and the second volume is a slice. In this embodiment, the first and second set of MRF parameters may be selected to cause different gradients (e.g., slice select gradients, read gradients) to be applied to the first and second slice. The gradients may differ before, during, or after acquiring the first and second NMR signals. In one embodiment, different slice select gradients are configured to cause a phase shift between the first and second slice. The phase shift may be configured to spatially shift the first slice and the second slice relative to each other in an image field-of-view, to produce spatial blurring in at least one of the first slice or the second slice, or to produce a spatial distortion in at least one of the first slice or the second slice.

In one embodiment, different slice select gradients may match at least one readout gradient applied during acquisition of the first or second NMR signals. The readout gradient may be applied in a direction different than the different slice select gradients. The readout gradient may include a first readout gradient applied in a first direction orthogonal to the slice-encoding direction and a second readout gradient applied in a second direction orthogonal to the slice-encoding direction. In one embodiment, the magnetic gradient applied along the slice-encoding direction matches the readout gradient by weighting a combination (e.g., addition) of the first readout gradient and the second readout gradient.

While FIG. 12 illustrates various actions occurring in serial, it is to be appreciated that various actions illustrated in FIG. 12 could occur substantially in parallel. By way of illustration, a first process could cause different NMR excitations in different volumes, a second process could collect NMR signals from the simultaneously excited volumes, and a third process could match acquired signals to stored signals. While three processes are described, it is to be appreciated that a greater and/or lesser number of processes could be employed.

Figure 13:
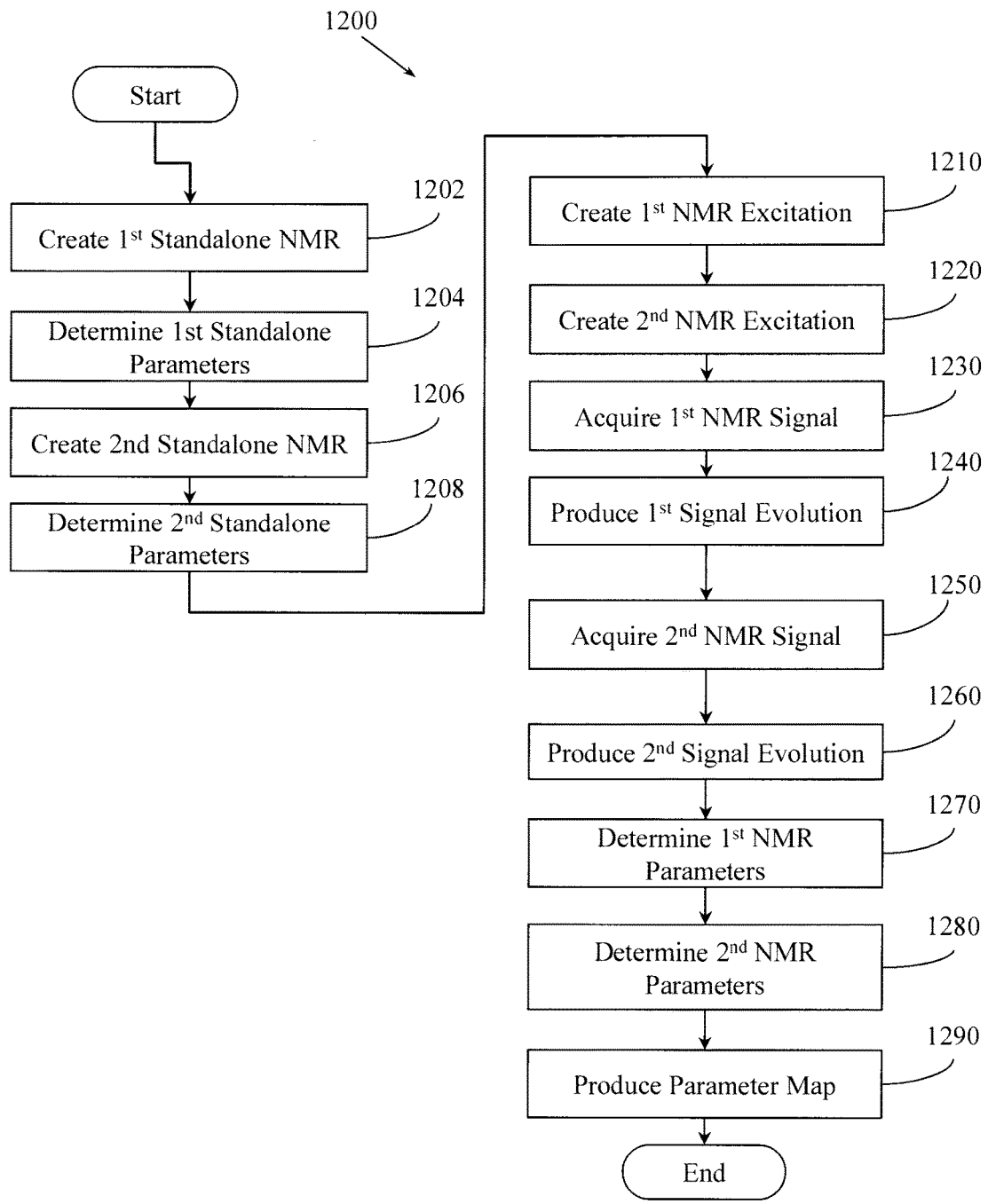
FIG. 13 illustrates an example method associated with MRF-SMVA.

FIG. 13 illustrates another embodiment of method 1200 (FIG. 12). This embodiment also includes actions 1202, 1204, 1206, and 1208. Method 1200 may include, at 1202, controlling the MRI apparatus to create a first single volume NMR excitation in the first volume according to the first set of NMR parameters, acquiring a first single volume set of NMR signals produced by the first volume in response to the first single volume NMR excitation, and producing a first single volume signal evolution from the first single volume set of NMR signals. The first single volume NMR signals are acquired independently of the first NMR signals and the second NMR signals. The first single volume NMR excitation is active at a time other than when the first NMR excitation and the second NMR excitation are active.

Method 1200 may also include, at 1204, simultaneously determining two or more first single volume quantitative MR parameters for a portion of the first volume based on a comparison of the first single volume evolution to known signal evolutions.

Method 1200 may also include, at 1206, controlling the MRI apparatus to create a second single volume NMR excitation in the second volume according to the second set of NMR parameters, controlling the MRI apparatus to acquire a second single volume set of NMR signals produced by the second volume in response to the second single volume NMR excitation, and producing a second single volume signal evolution from the second single volume set of NMR signals. The second single volume NMR signals are acquired independently of the first NMR signals and the second NMR signals, and the second single volume NMR excitation is active at a time other than when the first single volume NMR excitation, the first NMR excitation, and the second NMR excitation are active.

Method 1200 may also include, at 1208, simultaneously determining two or more second single volume quantitative MR parameters for a portion of the second volume based on a comparison of the second single volume evolution to known signal evolutions.

In this embodiment, producing the parameter map or the image at 1290 may be based additionally on the two or more first single volume quantitative MR parameters, and the two or more second single volume quantitative MR parameters.

More generally, an example method may create a parameter map or an image from data acquired by controlling an MRI apparatus to perform MRF-SMVA. The method may include controlling the MRI apparatus to create different NMR excitations in a plurality of volumes (e.g., slices) in a sample using a plurality of different MRF pulse sequences described by a plurality of MRF parameters. The method may also include controlling the MRI apparatus to acquire NMR signals produced by members of the plurality of volumes in response to the different NMR excitations. A plurality of signal evolutions may then be produced from the NMR signals. Once the signal evolutions have been produced, the method may include simultaneously determining quantitative MR parameters for a volume in the plurality of volumes based on a comparison of members of the plurality of signal evolutions to known signal evolutions. Once the quantitative MR parameters are known, the method may then produce the parameter map or the image using the quantitative MR parameters. This method provides faster acquisition over conventional systems because at least two members of the plurality of volumes have NMR excitations active simultaneously, and the NMR signals are acquired simultaneously from the at least two members of the plurality of volumes.

In one embodiment, at least three members of the plurality of volumes have NMR excitations active simultaneously, and the NMR signals are acquired simultaneously from the at least three members of the plurality of volumes. In one embodiment, at least four members of the plurality of volumes have NMR excitations active simultaneously, and the NMR signals are acquired simultaneously from the at least four members of the plurality of volumes. In other embodiments, a greater number of volumes (e.g., 8) may be active.

Figure 14:
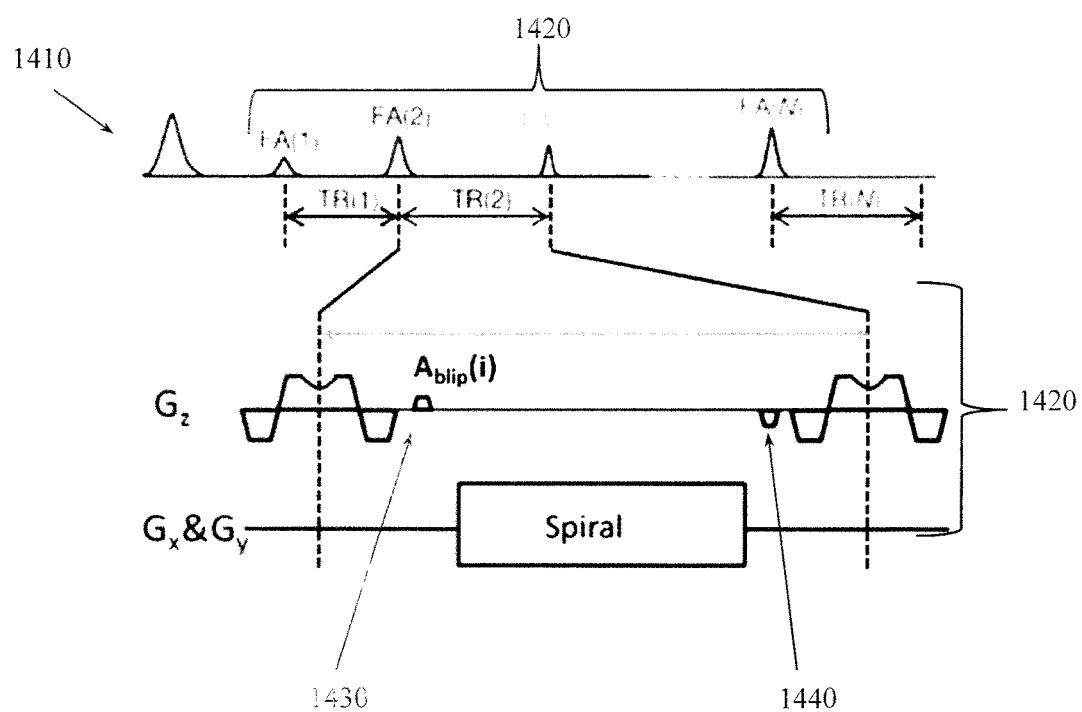
FIG. 14 illustrates an example t-blipped SMS-MRF acquisition.

FIG. 14 illustrates additional detail for one approach for performing simultaneous multi-slice (SMS) acquisition in MRF to accelerate MRF acquisition. The approach may be referred to as a T-blipped SMS-MRF method. The t-Blipped SMS-MRF method includes adding a $G_z$ blip before a data acquisition window and balancing the $G_z$ blip with a $G_z$ blip of opposing polarity at the end of the data acquisition window. The $G_z$ blip approach causes the NMR signals from different simultaneously excited slices to be encoded with different phases without disturbing the signal evolution. Varying the $G_z$ blip area or polarity as a function of the data acquisition period causes the differential phase for a slice to vary as a function of time. t-Blipped SMS-MRF data may be reconstructed using a combined slice-direction sensitivity encoding (SENSE) and modified dictionary matching method.

Experimental Monte Carlo simulations reveal good accuracy and precision for the parameter mapping from multi-band factor (MB)=2 (e.g., multi-slice, multi-volume) t-Blipped SMS-MRF when compared to results from conventional MRF data with concordance correlation coefficients (CCC) of 0.96 for $T_1$ estimates and 0.90 for $T_2$ estimates. For in vivo experiments, $T_1$ and $T_2$ maps from MB=2 t-Blipped SMS-MRF have a high agreement with maps from conventional MRF. Thus, the MB=2 t-Blipped SMS-MRF acquisition/reconstruction method has been demonstrated and validated to provide more rapid data acquisition in the MRF framework. Faster data acquisition may in turn lead to faster parameter mapping or image production.

MRF can be used to produce multiple parameter maps by matching a train of data associated with highly under-sampled images, pixel by pixel, to data in a pre-calculated dictionary. The use of different spiral interleaves for acquisitions at different acquisition times provides incoherent aliasing as a function of time to enable this matching to work for a highly under-sampled dataset. t-Blipped SMS-MRF introduces slice-specific phase terms across time. In one embodiment, the t-Blipped method involves adding a $G_z$ blip before a data acquisition window and balancing the $G_z$ blip after the acquisition window. Adding the $G_z$ blip causes signals from different simultaneously excited slices to be encoded with different phases depending on their slice positions. With the added phase differences on the slices, voxels after separation still have residual aliasing, but the aliasing from the other slice is phase modulated along time axis.

FIG. 14 illustrates an example t-Blipped SMS-MRF sequence. Similar to the MRF sequence, the t-Blipped SMS-MRF sequence uses a varying RF and TR train played on an inversion recovery Fast-Imaging with Steady-state free Precession (IR-TrueFISP) based sequence. In one embodiment, a single band RF pulse 1410 may be replaced with a multi-band variable rate selective excitation (VERSE) pulse and small $G_z$ gradient blips 1430 and 1440 of area $A_{blip}$ and $-A_{blip}$ are added before and after the data acquisition window respectively. The added $G_z$ gradient blip introduces a phase difference for simultaneously excited slices. In one embodiment, the phase difference equals $2\pi\gamma A_{blip} D$, where $\gamma$ is the gyromagnetic ratio and D is distance between the simultaneously excited slices. For one embodiment of the MB=2 case of t-Blipped SMS-MRF, $G_z$ blips are applied to create $\pi$ phase difference between two simultaneously excited slices for the even acquisition periods, while no $G_z$ blips are applied for the odd acquisition periods. In one embodiment, blips can be added to the slice refocus/prefocus gradient to save time.

RF pulse train 1420 is one example pulse train that may be used in the IR-trueFISP sequence on which the MRF acquisition is based. The inversion pulse 1410 is non-selective but subsequent RF pulses are multi-band RF that simultaneously excite 2 slices. The gradients 1420 perform slice selection with VERSE during the RF and the t-Blipped method of imposing phase shifts on the different slice positions of the excited slices in one acquisition period. In the example MB=2 acquisition, $A_{blip}$ is the area added to the normal prephasing lobe to provide a phase difference of $\pi$ to the simultaneously excited slices in the even numbered TRs. The blip area is rewound after the readout. No blip is added on the odd numbered TRs, which creates a zero phase difference between the slices. The signal may then be read out using a spiral trajectory.

Experiments to prove the efficacy of t-Blipped SMS-MRF employed a standard MRF reconstruction method for quantitative parameters estimates. For an acquisition period, the signal from a receiver coil was first reconstructed using a non-uniform fast Fourier transform (NUFFT) based gridding method and then combined using coil sensitivities estimated from the adaptive combination method applied to the average images across the initial 100 reconstructed time points. For a voxel, the reconstructed time-series was then compared to a pre-computed MRF dictionary. For a voxel, quantitative parameter estimates were obtained from the dictionary element with the highest normalized correlation to the time-series signal of that voxel.

In one embodiment of t-Blipped SMS-MRF, the above reconstruction procedure was modified to facilitate estimation of quantitative parameters for simultaneously acquired slices. Gridding reconstruction was applied to slice-collapsed data. Slice-direction SENSE reconstruction was then applied using coil sensitivity estimates obtained from the slice-collapsed SMS-MRF data via a modified adaptive combination procedure. Since the voxel aliasing in the slice and the in-plane directions were coupled, the application of slice-direction SENSE did not provide a clean separation between the two imaging slices. While clean separation was not produced, slice-direction SENSE provided partial separation and phase modulation from the $G_z$ blips. This partial separation further decoupled signals in order to provide accurate quantitative parameter estimation. Phase demodulation for the separate signals from simultaneous excited slices was applied before dictionary matching. After an initial dictionary matching, this reconstruction pipeline provided good quantitative estimates in most areas of the imaging slices. To further improve this reconstruction pipeline for a few speckled voxels where large errors in the off-resonance estimate were observed, prior knowledge of slowly varying off resonance maps was used. An estimated off-resonance map was median filtered [5 voxel×5 voxel] and voxels with a large change in off-resonance of more than 10 Hz were recorded. For these voxels, a secondary dictionary-matching was performed. In the secondary dictionary-matching, the off-resonance value from the median filtered off-resonance map was used as an anchor to improve the estimated values for $T_1$, $T_2$ and $M_0$.

Figure 15:
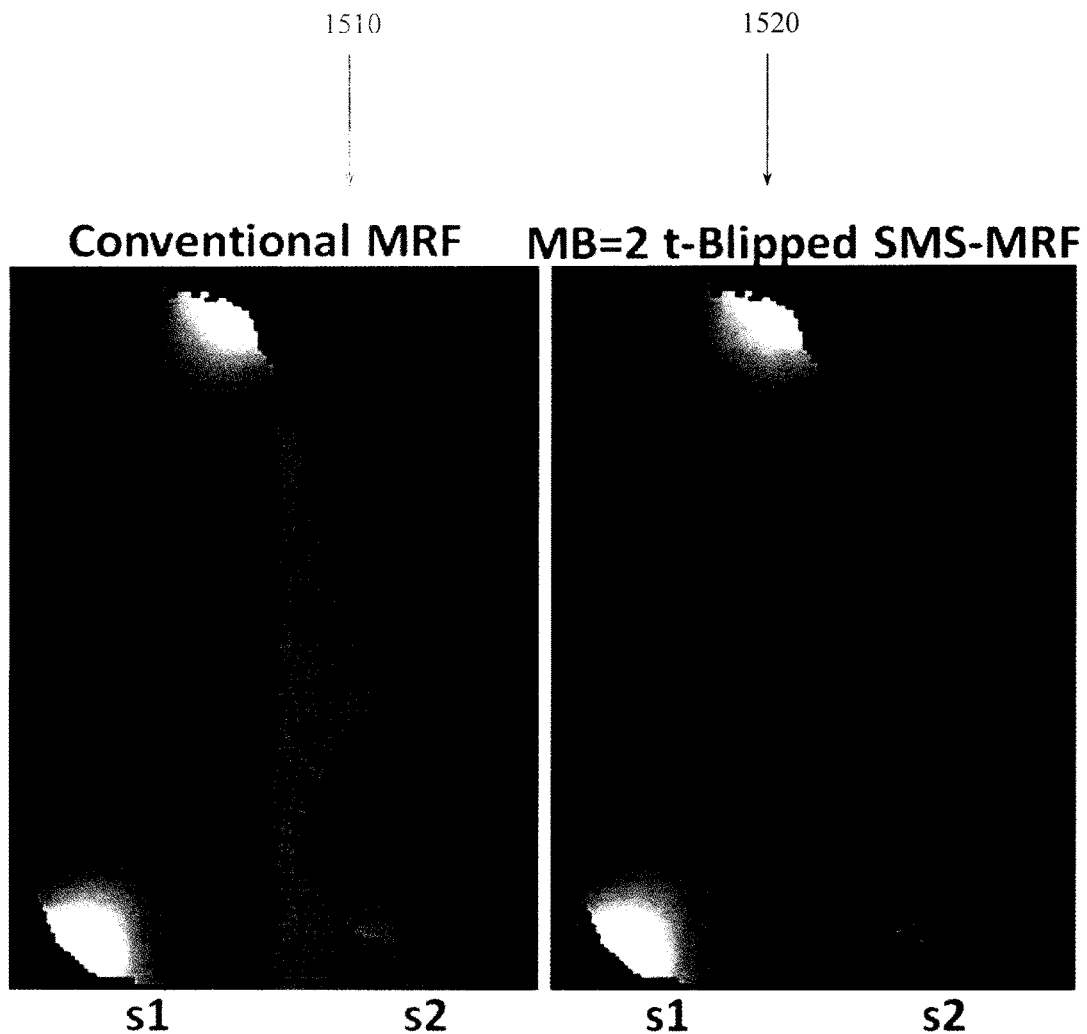
FIG. 15 illustrates example coil sensitivity maps.

FIG. 15 illustrates example coil sensitivity maps from conventional MRF data 1510 and MB=2 t-blipped SMS-MRF data 1520. A modified adaptive combination method may be used to obtain coil sensitivity estimates from the t-Blipped SMS-MRF data. In one embodiment, the signal phase of slice one S1 located at the isocenter is not modulated. The signal phase of slice two S2 contains a 0-$\pi$ alternating phase modulation as a function of acquisition period. To estimate the coil sensitivity for slice one, the data from the first 400 time points were directly summed. With this summation, the 0-$\pi$ phase modulation in slice two causes the signal from adjacent time points in slice two to approximately cancel out, while for slice one, the signal sums constructively to average out the image contrast of different time points to provide smooth coil sensitivities. To estimate the coil sensitivity for slice two, the data from the first 400 time points were phase demodulated by 0-$\pi$ and then summed.

Figure 16:
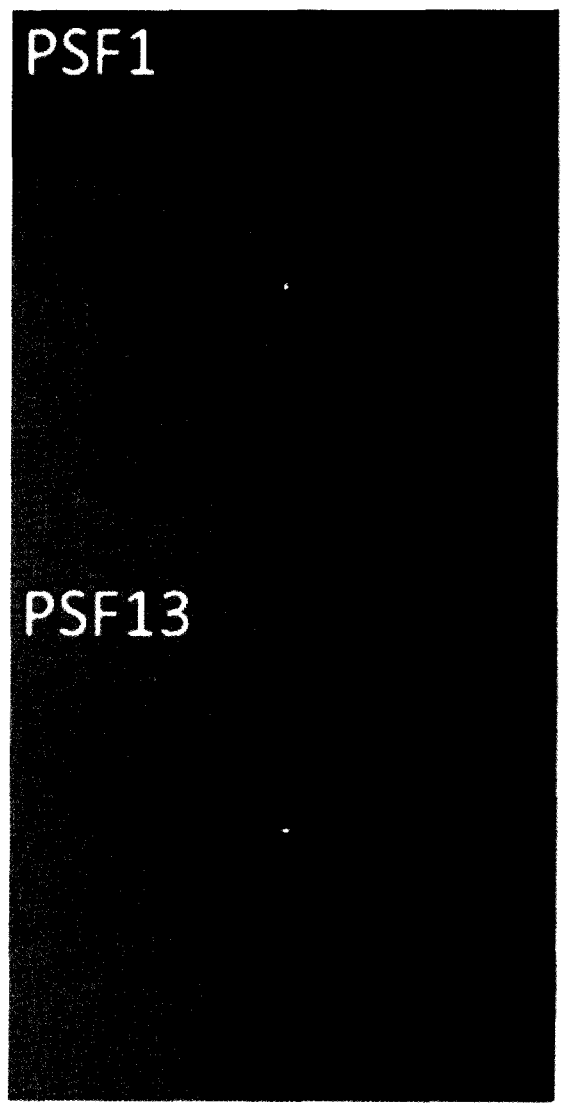
FIG. 16 illustrates point spread functions.

To study and validate the t-Blipped SMS-MRF method, data was acquired in vivo from a single healthy volunteer with institutionally approved protocol consent. Two datasets were acquired. A first data set included data from two slices of conventional MRF data acquired at a distance of 40 mm apart at an acquisition time of 10 s/slice. A second data set included data from t-Blipped SMS-MRF data with MB=2 (e.g., two slices). Acquiring the same two slices simultaneously resulted in an improved acquisition rate of 5 s/slice. Both conventional and SMS-MRF experiments were performed with a Perlin noise shaped acquisition period time distribution ranging from 8.2 ms to 10.56 ms. The inversion pulse was non-selective and adiabatic, and the excitation RF in each acquisition period was VERSE with a slice thickness of 5 mm. One of 48 variable density spiral interleaves (48×) was used to read out the signal with a designed square field of view (FOV) of 300 mm and square matrix size of 128. After the inversion, data for 48 spiral interleaves was repeatedly acquired in a sequential manner until a total of 1000 time points were created per inversion pulse. Following a non-selective inversion pulse, data was acquired using slice selective excitation for a period of ~10 s (1000 data acquisitions) to provide adequate time for the out of slice's gray and white matter magnetization to recover prior to the next inversion pulse and acquisition. The point spread functions (PSF) from two selected spiral interleaves are shown in FIG. 16.

Improvements achieved using an example MB=2 t-Blipped SMS-MRF method are seen by comparing the following acquisition alternatives: i) conventional MRF results obtained from 10 s/slice scan (20 s total acquisition time), ii) conventional MRF results obtained from shorter time-series (resulting in 5 s/slice scan that therefore matched the 10 s total acquisition of the MB=2 SMS-MRF acquisition, and iii) MB=2 t-Blipped SMS-MRF results obtained from a 5 s/slice scan (10 s total acquisition time).

Simulations using a bootstrapped Monte Carlo method were performed on i) conventional MRF results obtained from 10 s/slice scan, ii) conventional MRF results obtained from a shorter time-series using 5 s/slice scan, iii) MB=2 t-Blipped SMS-MRF results obtained from a 5 s/slice scan, and iv) MB=2 non-Blipped SMS-MRF. In conventional MRF cases, noise was added to the acquired data by drawing from the noise distribution defined by the measured noise-covariance matrix. The added noise level was set to be the same as the noise level of the acquired data, which caused a doubling of the total noise in the single slice case. Sixty sets of two conventional MRF data were generated and reconstructed using the standard MRF reconstruction method. For the MB=2 t-Blipped SMS-MRF case, comparable data were simulated by summing the acquired single-slice MRF data. Summing the data doubled the noise. The comparable data included an added 0-π phase modulation to the second slice data prior to the summation. For the MB=2 non-Blipped SMS-MRF case, comparable data were simulated by summing the acquired single-slice MRF data. Noise was added to the synthesized t-Blipped and non-Blipped SMS-MRF data and 60 datasets were generated and reconstructed. For reference, 10 s/slice conventional MRF data without additional noise was reconstructed for comparison. Different metrics were adopted to evaluate the simulation results. One metric computed differences in the $T_1$ and $T_2$ mean maps of the evaluated cases and the reference maps to show the average bias. One metric computed averages of the $T_1$ and $T_2$ difference maps to indicate the total bias for an evaluated method. The evaluations included calculating the concordance correlation coefficients (CCC) in the brain area between average simulation values and reference results. In the evaluations, 100 random pixels per slice were picked and correlation plots between the average results and reference results were measured. A standard deviation value was used to indicate the confidence intervals at each point.

In addition to Monte Carlo simulation, reconstructions of in vivo data for the different acquisition cases were performed without added noise and the resulting $T_1$, $T_2$, off resonance and $M_0$ maps were compared.

Figure 17:
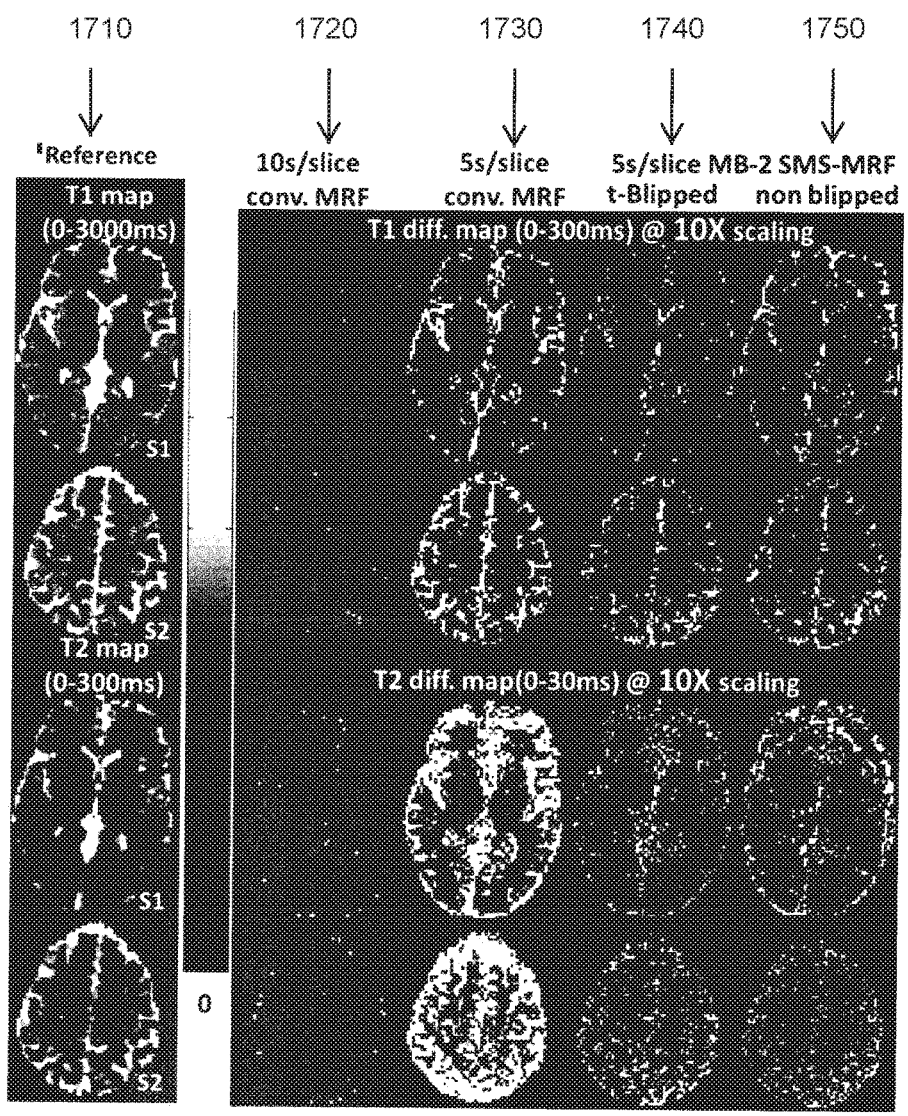
FIG. 17 illustrates example T1 and T2 difference maps from simulations and experiments.

FIG. 17 shows the average $T_1$ and $T_2$ difference maps based on the Monte Carlo simulation of the four cases as compared to results from the 10 s/slice reference conventional MRF case without added noise. First column 1710 shows the reference T1 and T2 maps from 10 s conventional MRF. Columns 1720-1750 show the absolute T1 and T2 difference between mean Monte Carlo simulation results and the reference maps. Column 1720 illustrates 10 s/slice conventional MRF, column 1730 illustrates 5 s/slice conventional MRF, column 1740 illustrates 5 s/slice MB=2 t-Blipped SMS-MRF, and column 1750 illustrates 5 s/slice MB=2 non-Blipped SMS-MRF.

The 10 s/slice conventional MRF case shows the smallest difference, while the 5 s/slice conventional MRF case shows the largest. The 5 s/slice MB=2 t-Blipped SMS-MRF case falls between the two conventional MRF cases, which demonstrates an improvement in acquisition time efficiency with this slice accelerated acquisition. The mean $T_1$ and $T_2$ differences in the brain area, where the reference $T_2$ value is within a reasonable range for gray and white matter (below 300 ms), were also calculated. For the 10 s/slice conventional MRF case, the mean differences of $T_1$ and $T_2$ were 4.5 ms and 0.7 ms. For the 5 s/slice conventional MRF these were 87.7 ms and 23.3 ms, and for the 5 s/slice MB=2 t-Blipped case these were 75.4 ms 8.0 ms. The 5 s/slice MB=2 non-Blipped SMS-MRF case shows similar bias level with the t-Blipped case which shows a boundary artifact that is not seen in t-Blipped case.

Figure 18:
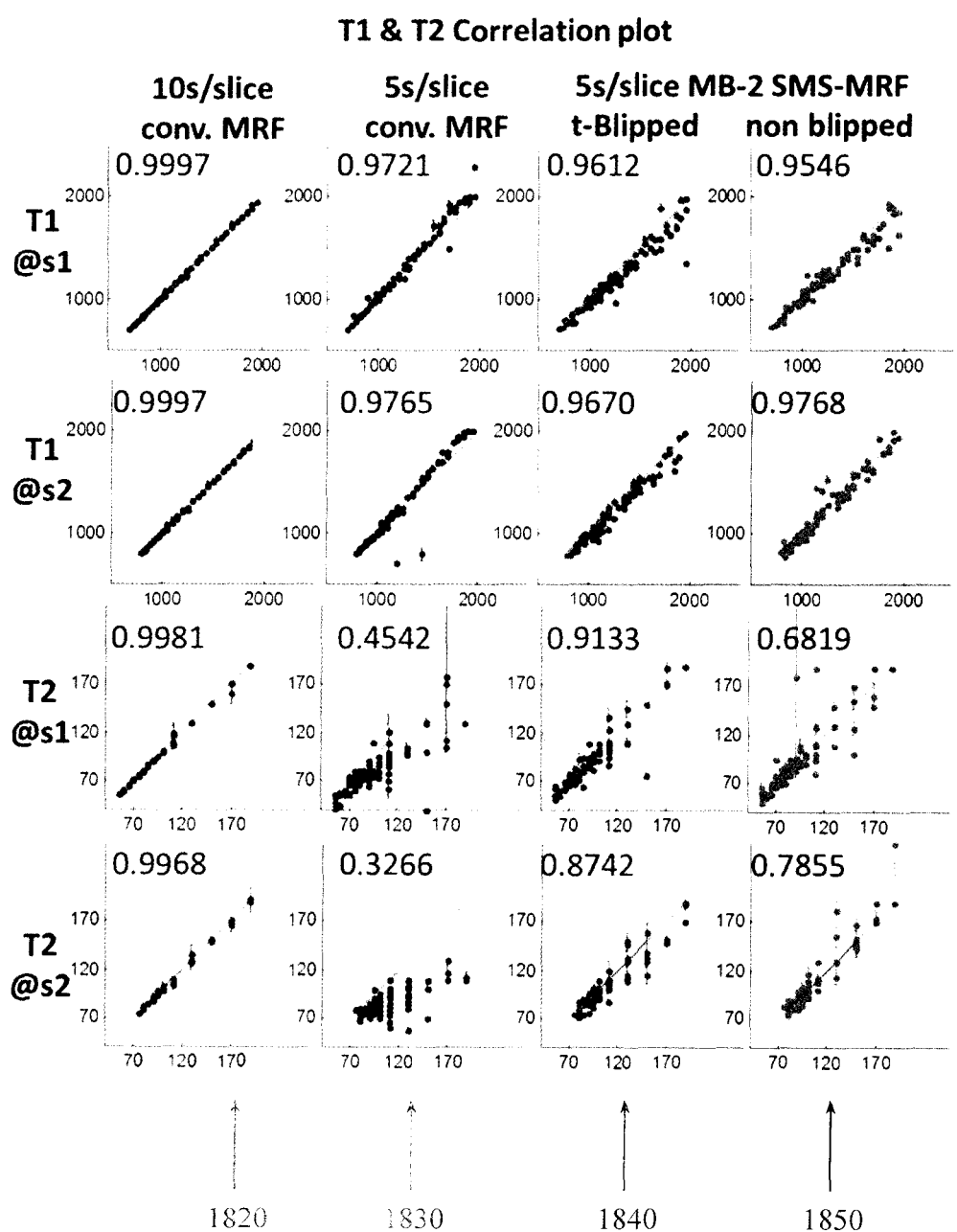
FIG. 18 illustrates example T1 and T2 correlation plots from simulations and experiments.

FIG. 18 shows correlation plots of mean+/−standard deviation of $T_1$ and $T_2$ values from 100 randomly picked voxels from the Monte Carlo simulations. The plots are labeled with the CCCs calculated for the brain area. The four acquisition alternatives (e.g., 10 s/slice conventional MRF 1820, 5 s/slice conventional MRF 1830, 5 s/slice MB=2 t-Blipped MRF-MSVA 1840, SMS-MRF non-blipped 1850) are compared to the 10 s/slice reference conventional MRF case without added noise. From these results, it can be observed that the consistency of $T_1$ estimates is better than $T_2$ estimates in all three cases, with the 5 s/slice conventional MRF case 1830 showing the largest bias and worst stability in both $T_1$ and $T_2$ estimates, the 10 s/slice conventional MRF case 1810 providing the best estimates, and t-Blipped case 1840 showing better consistency than non-Blipped case. In all cases, the standard deviation values, which are indicated as error bars on the plots, are smaller in comparison to the bias of these estimates.

Figure 19:
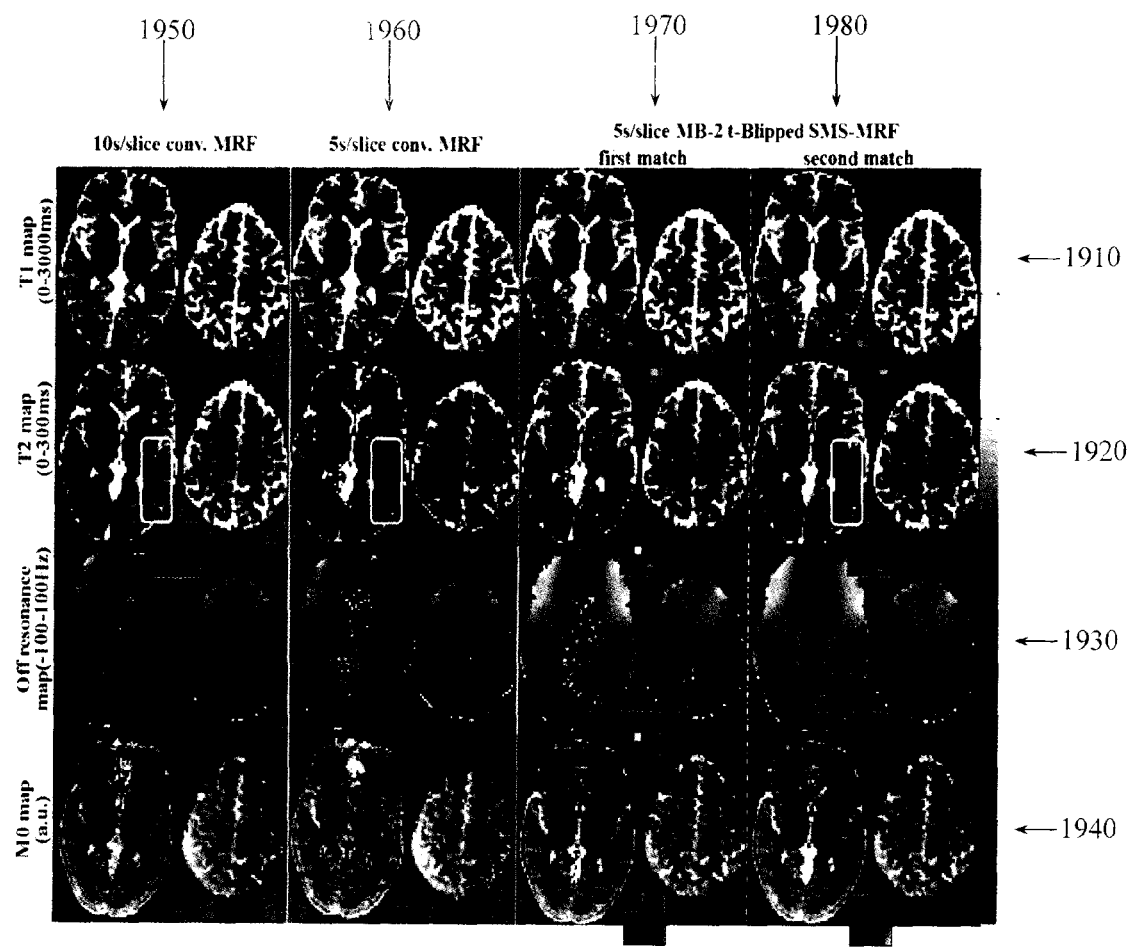
FIG. 19 illustrates example in vivo T1, T2, off resonance and M0 maps.

FIG. 19 shows in vivo results from the three acquisition cases, with results of MB=2 shown for both the first and the second dictionary matching. Row 1910 shows T1 maps. Row 1920 shows T2 maps. Row 1930 shows off-resonance maps. Row 1940 shows M0 maps. Overall, the MB=2 acquisition in column 1970, after the second matching step, provides comparable results to the 10 s/slice conventional MRF acquisition in column 1950 and better consistency when compared to the 5 s/slice conventional MRF case in column 1960. In the 5 s/slice conventional MRF results, the parameter maps appear more blurry with residual ringing artifacts that appear as areas designated by boxes. Additionally, as predicted by the simulation, the $T_2$ values in this case appear lower. Speckle artifact can also be observed. The MB=2 results demonstrate a significant improvement when compared to this acquisition of identical duration. After the second matching step for MB=2, the speckled artifacts in the $T_1$, $T_2$ and $M_0$ maps are successfully removed. The results of MB=2 are generally in accordance with that of the 10 s/slice conventional MRF case as predicted by simulation. Nonetheless, a small deviation can be observed in a somewhat lowered $T_2$ value of the upper imaging slice.

The preceding simulations and experimental results demonstrate the capability of an example t-Blipped SMS-MRF acquisition/reconstruction method in accelerating MRF through a MB=2 slice-accelerated acquisition. Example acquisition schemes reduce the MRF imaging time per slice by half. In one embodiment, an example acquisition scheme facilitates volumetric MRF mapping at high resolution in a clinically relevant time frame. While results for MB=2 have been illustrated, higher accelerations may be achieved by simultaneously exciting a greater number of slices. Given the number and variety of acquisition parameters that can be varied in MRF, including echo time (TE), a larger number of slices may be excited than is possible for conventional MRI. In different embodiments, 2, 3, 4, or even more slices may be simultaneously excited in different ways to produce signal evolutions that can be independently analyzed in parallel.

Full parallel imaging reconstruction at each acquisition time-point may be undesirable because the data may be highly under-sampled in the in-plane direction (e.g., up to 48x) with additional aliasing in the slice direction (MB=2). This aspect of the data makes it unsuitable to use the SENSE reconstruction method used in previous SMS works that un-alias in both the in-plane and slice directions simultaneously. Instead, example apparatus and methods may use slice-direction SENSE reconstruction to provide partial un-aliasing in the slice direction. In one embodiment, k-space based parallel imaging reconstructions that facilitate separate un-aliasing in the slice direction only may be employed. In one embodiment, GROG, slice-GRAPPA, or combinations thereof may be employed.

Figure 20:
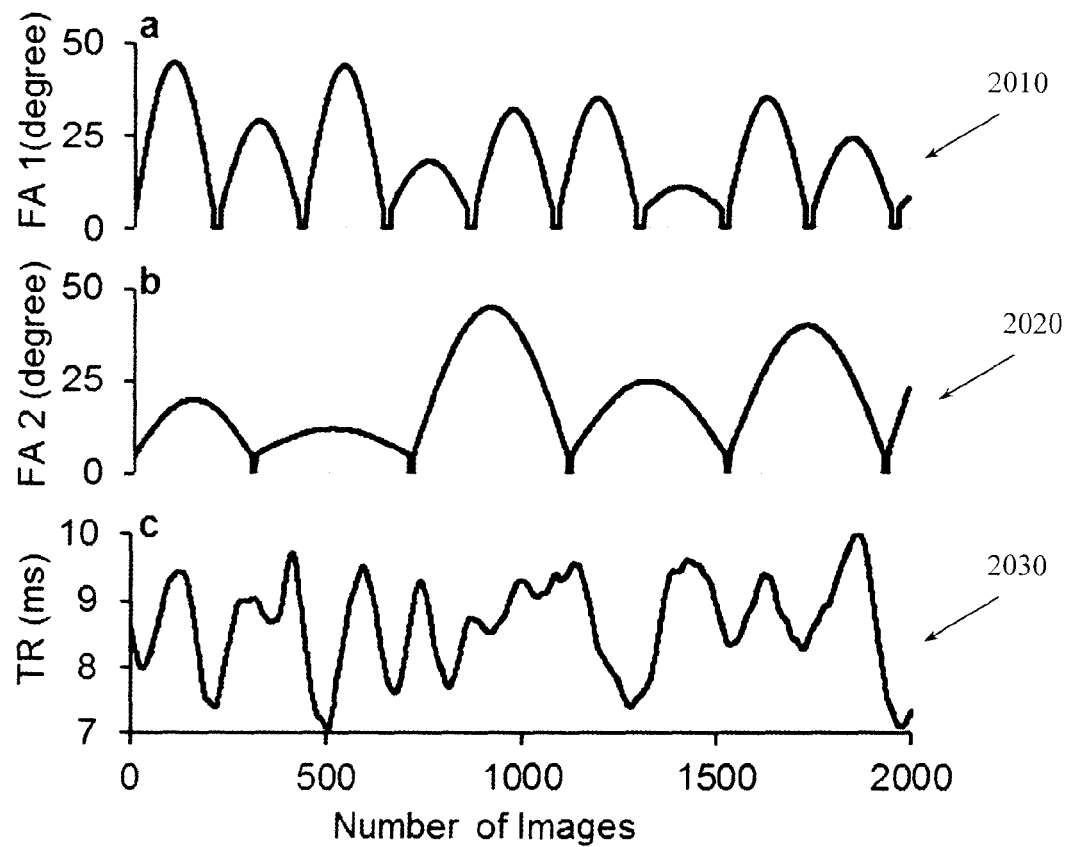
FIG. 20 illustrates flip angle patterns employed in one embodiment of MRF-SVMA that uses a Fast-Imaging with Steady-state free Precession (FISP) type sequence.

FIG. 20 illustrates flip angle patterns employed in one embodiment of MRF-SVMA that uses a FISP type sequence. A multiband (MB) RF pulse excites 2 slices simultaneously with different flip angles and RF phases. To generate unique signal shapes for different tissue types in MRF, the flip angles may be sinusoidally varied from 5 degrees to about 45 degrees. For an MB=2 acceleration case, one slice may be excited by a flip angle pattern 2010 with the RF phase of zero degrees. The second slice may be excited by flip angle pattern 2020 with alternating RF phase between 0 and 180 degrees. The repetition times may be smoothly varied from 7 to 10 ms using a Perlin noise pattern 2030. A spiral trajectory using the minimum-time gradient design may be used to acquire the data. In one embodiment, the spiral trajectory may use a uniform density spiral that uses 48 interleaves to fully sample a 256×256 k-space. Different interleaves may be employed to sample different sized k-spaces. The in-plane spatial resolution may be, for example, 1.2×1.2 mm$^2$ with a slice thickness of 5 mm. Different resolutions and different slice thicknesses may be employed. In one embodiment, 2000 time points with one spiral interleaf per time point may be acquired for the MRF scan. In this example, the SMS-MRF scan may take less than 20 seconds to acquire 2000 time points with one interleaf per time point.

Since multiple slices are simultaneously experiencing NRM, in one embodiment the signals produced by the slices may be received as a mixed signal. The mixed signal may include elements from two highly uncorrelated signal evolutions. Thus, in one embodiment, two dictionaries may be simulated using, for example, the extended phase graph (EPG) algorithm with the same repetition times but different flip angles and RF phases. The two different dictionaries may be suitable for matching different families of signal evolutions. Example dictionaries may contain the signal evolutions for a range of $T_1$ (20~3000 ms) and $T_2$ (10~300 ms) values. In one embodiment, MRF pattern-matching may be applied to the mixed signal, once for each dictionary, to retrieve quantitative maps of the different slices. While two slices and two dictionaries are described, a greater number of slices or dictionaries may be employed.

Figure 21:
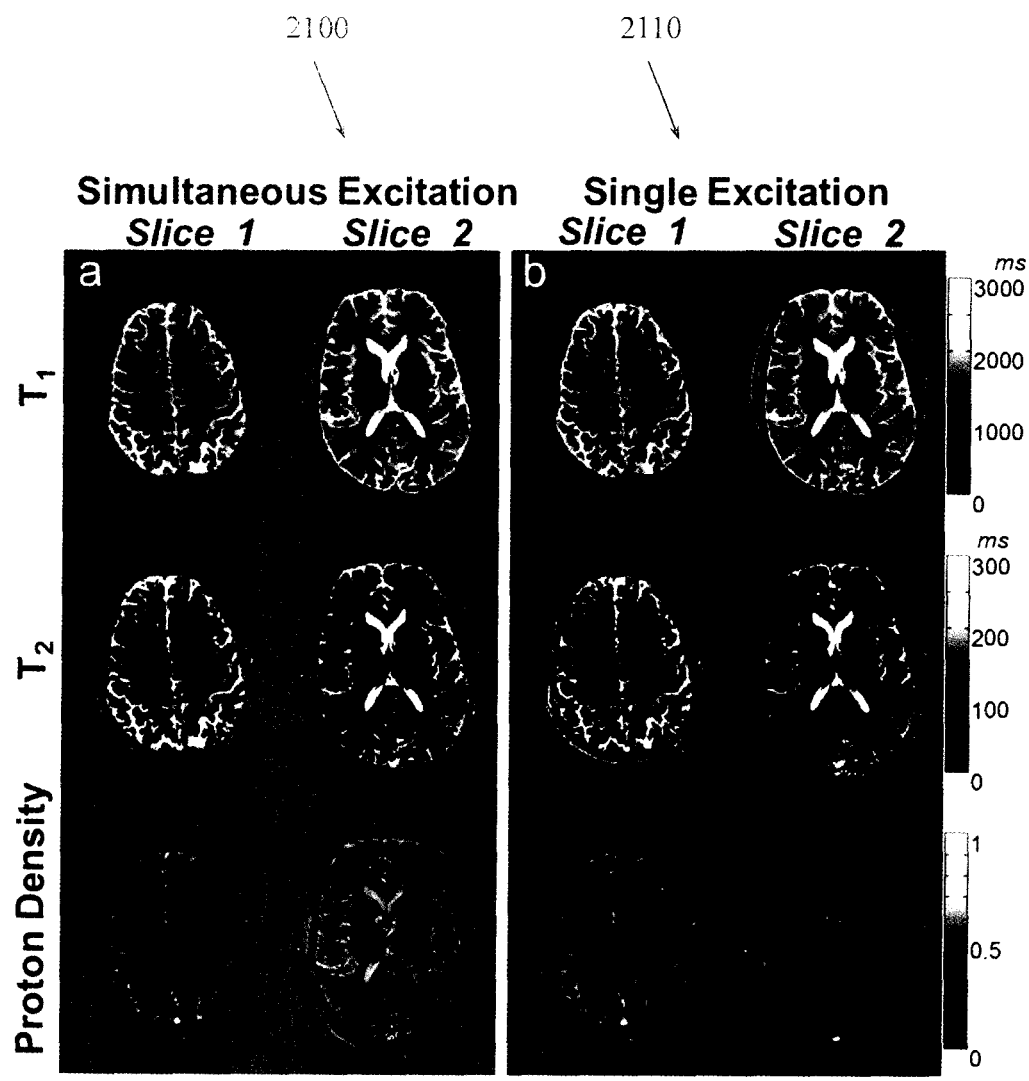
FIG. 21 illustrates example results.

FIG. 21 illustrates example results. Column 2100 shows $T_1$, $T_2$ and proton density maps generated from SMS-MRF acquisitions for two slices. Column 2110 shows the maps from the corresponding single slice acquisitions. The mean values of $T_1$ and $T_2$ from white matter and grey matter are in good agreement with previous results. Due to the unique signal evolutions for each slice, quantitative maps for the multiple slices can be simultaneously retrieved by MRF pattern-matching.

Example apparatus and methods accelerate MRF acquisition using SMS. In one embodiment, a t-blipped SMS-MRF method that includes additional $G_z$ blip encodings to provide phase modulation between the signals of simultaneously acquired slices and to create controlled-aliasing in the temporal axis is employed. The blip provides controlled-aliasing in the MRF time series rather than a spatial dimension and thus may be referred to as t-blipped CAIPI (controlled aliasing in parallel imaging) SMS. Simulations and in vivo acquisitions demonstrate the ability of t-blipped SMS-MRF to accelerate MRF acquisition by 2-fold (MB=2) retaining good parameter mapping at half the acquisition time.

Figure 22:
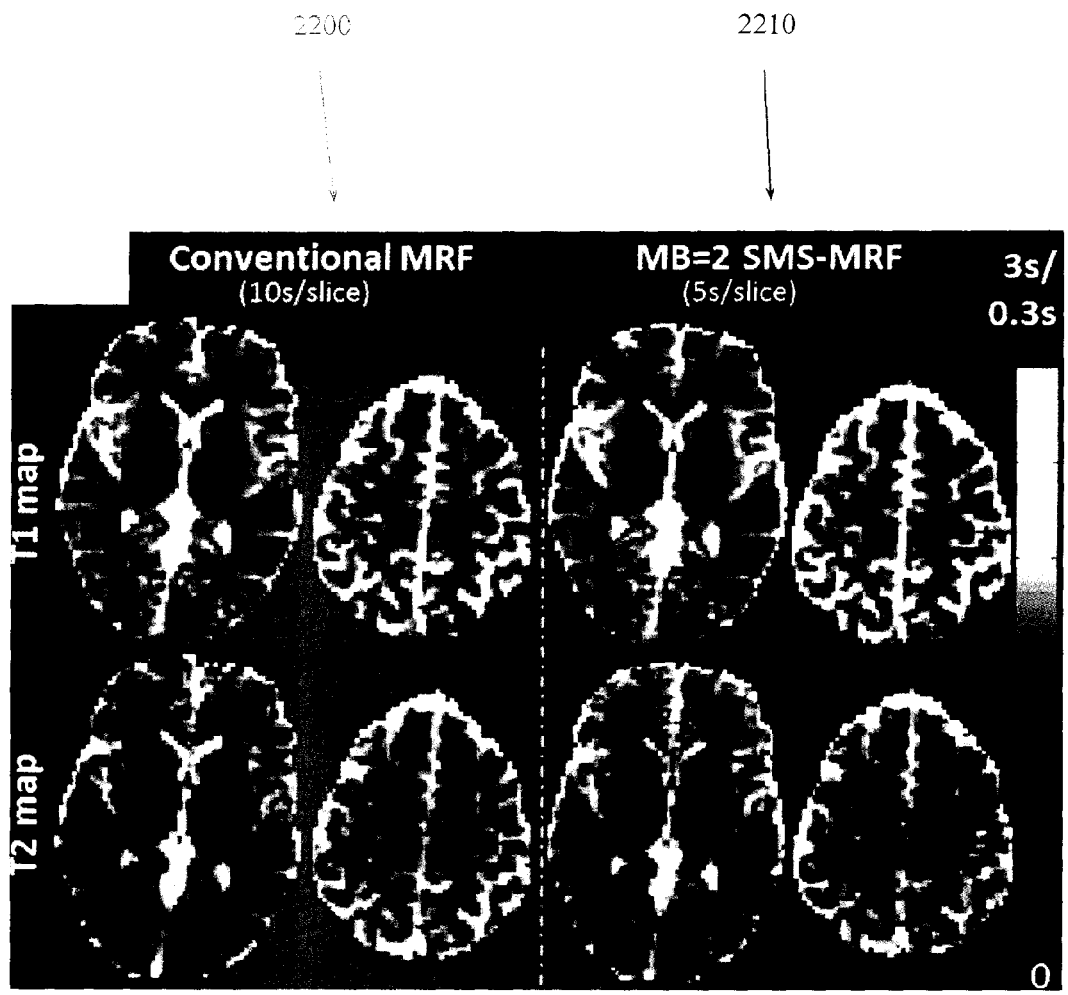
FIG. 22 illustrates in vivo T1 and T2 maps produced using the approach associated with FIG. 14.

FIG. 22 shows in vivo T1 and T2 maps produced using the approach associated with FIG. 14. Maps 2200 were acquired with a conventional one slice at a time approach consuming 10 s/slice. Maps 2210 were acquired using an MB=2 t-blipped SMS-MRF approach consuming 5 s/slice.

In different embodiments, SMS-MRF may be further accelerated using various reconstruction techniques. For example, data acquired using SMS acquisition techniques may be reconstructed with GROG+slice-GRAPPA (GsG) reconstruction. GsG provides a k-space parallel imaging approach that facilitates improved un-aliasing performance in the slice direction for the highly under-sampled slice-collapsed MRF signal.

Figure 23:
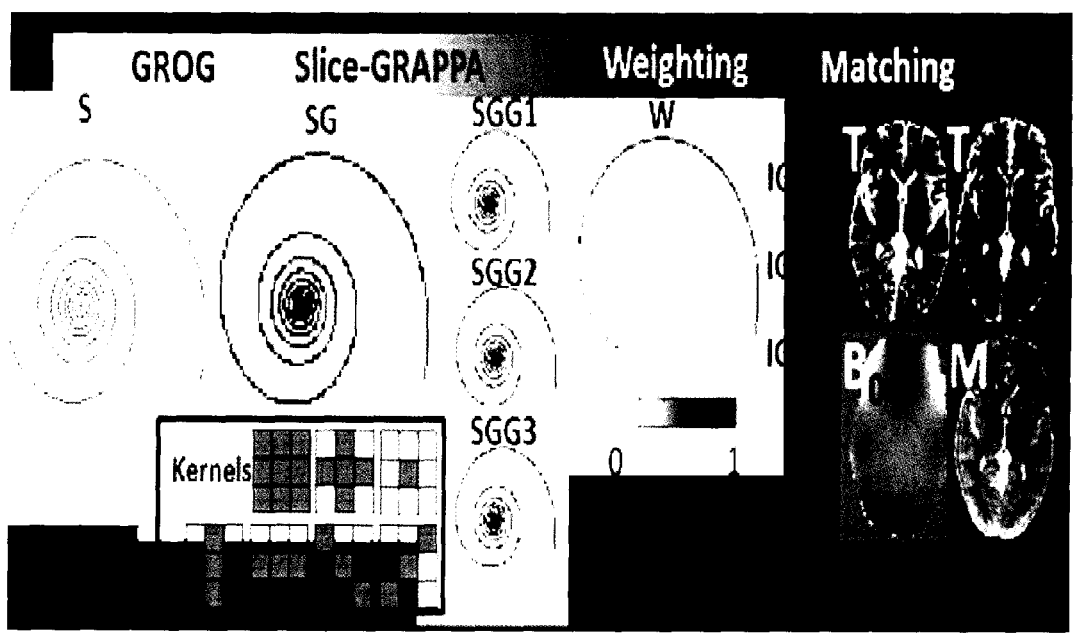
FIG. 23 illustrates an example GROG+slice-GRAPPA (GsG) reconstruction pipeline.

FIG. 23 shows an example GsG reconstruction pipeline. This GsG pipeline was modified from a pseudo-Cartesian GRAPPA approach. First, in-plane GROG was applied to the collapsed k-space data S to obtain gridded data SG, where the $G_x$ and $G_y$ GROG weights were determined from the manually collapsed GRE data. Second, slice-GRAPPA kernels for 7 different patterns were calculated from the single slice GRE data. Points in SG k-space data were grouped to one of the patterns and applied with the corresponding kernel to generate the slice-unaliased SGG k-space data. SGG k-space data was then inversely weighted by its density W, which was calculated by counting the numbers along the time series and dividing by the total time points. After weighting, the data was Fourier transformed and coil combined into image IGG in which the coil sensitivity maps were estimated from the acquired gradient recalled echo (GRE) data. Dictionary matching was then applied for the slices to obtain the four parameter maps. Different approaches may be employed in different embodiments.

Figure 24:
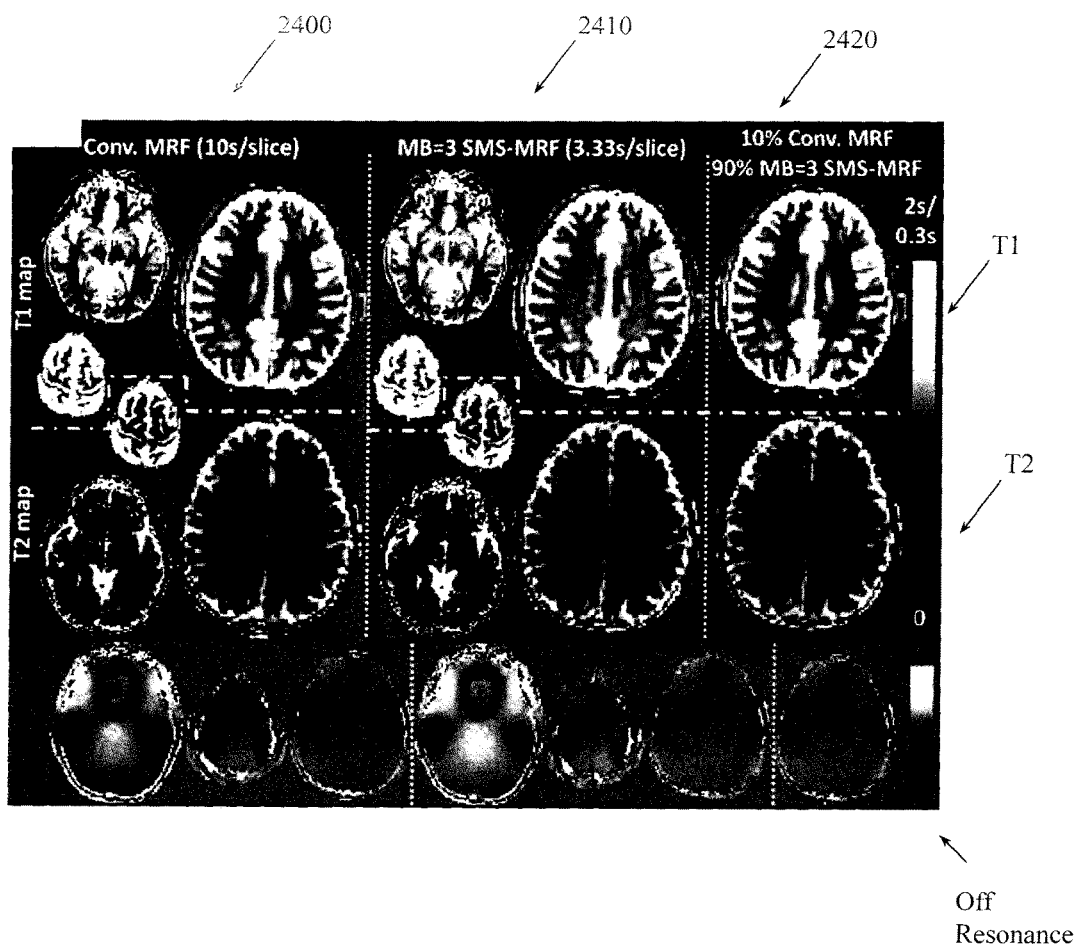
FIG. 24 illustrates in vivo T1, T2 and off resonance maps.

FIG. 24 shows in vivo T1, T2 and off resonance maps 2400 from conventional MRF performed one slice at a time at 10 s/slice. FIG. 24 also shows in vivo T1, T2 and off resonance maps 2410 from MB=3 SMS-MRF performed at 3.33 s/slice. FIG. 24 also shows in vivo T1, T2, and off resonance maps 2420 from mixed conventional MRF and MB=3 SMS-MRF. The results demonstrate consistency between conventional MRF and accelerated MB=3 SMS-MRF. Column 2420 represents reconstruction performed on data where the first 10% of the time points are acquired from conventional single slice MRF and the later 90% of the time points are acquired from MB=3 SMS-MRF. Column 2420 illustrates significant improvement with results resembling that from the conventional MRF.

The results demonstrate that GsG reconstruction complies well with a t-blipped SMS-MRF acquisition scheme which facilitates MB=3 acceleration for MRF. Since the signal from the first several hundred time points is more $T_1$ weighted due to the applied inversion pulse, one embodiment replaces the first 10% of the time points of MB=3 SMS-MRF with conventional MRF data, which resulted in improved $T_1$ and $T_2$ consistency. While MB=3 is illustrated, different (e.g., greater) MB may be employed.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. "Computer-readable storage device" does not refer to propagated signals. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is inclusive in a manner similar to the term "comprising" as that term is interpreted when employed as a transitional word in a claim.

To the extent that the term "or" is employed in the detailed description or claims (e.g., A or B) it means "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it conveys the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it conveys the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . 0 (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method for creating a parameter map or an image from data acquired by controlling a magnetic resonance imaging (MRI) apparatus to perform magnetic resonance fingerprinting with simultaneous multivolume acquisition (MRF-SMVA), comprising:
   controlling the MRI apparatus to create a first nuclear magnetic resonance (NMR) excitation in a first volume in a sample according to a first set of magnetic resonance fingerprinting (MRF) parameters;
   controlling the MRI apparatus to create a second, different NMR excitation in a second volume in the sample according to a second set of MRF parameters;
   controlling the MRI apparatus to acquire first NMR signals produced by the first volume in response to the first NMR excitation;
   producing a first signal evolution from the first NMR signals, the first signal evolution having complex values with an arbitrary phase relationship;
   controlling the MRI apparatus to acquire second NMR signals produced by the second volume in response to the second NMR excitation;
   producing a second signal evolution from the second NMR signals, the second signal evolution having complex values with an arbitrary phase relationship;
   simultaneously determining two or more first quantitative magnetic resonance (MR) parameters for a portion of the first volume based on a comparison of the first signal evolution to one or more known signal evolutions;
   simultaneously determining two or more second quantitative MR parameters for a portion of the second volume based on a comparison of the second signal evolution to one or more known signal evolutions; and producing the parameter map or the image based, at least in part, on the two or more first quantitative MR parameters or based, at least in part, on the two or more second quantitative parameters, where the first NMR excitation and the second NMR excitation are active simultaneously, and where the first NMR signals and the second NMR signals are acquired simultaneously.

2. The method of claim 1, comprising acquiring the first NMR signals and the second NMR signals simultaneously as discrete signals.

3. The method of claim 2, comprising independently comparing the first signal evolution and the second signal evolution to the one or more known signal evolutions.

4. The method of claim 1, comprising acquiring the first NMR signals and the second NMR signals simultaneously as a mixed signal, where the first signal evolution and the second signal evolution are combined as a mixed signal evolution.

5. The method of claim 4, comprising comparing the mixed signal evolution to the one or more known signal evolutions.

6. The method of claim 4, comprising separating the mixed signal into the first signal evolution and the second signal evolution before determining the two or more quantitative MR parameters for the portion of the first volume and before determining the two or more quantitative MR parameters for the portion of the second volume.

7. The method of claim 6, comprising individually comparing the first signal evolution and the second signal evolution to the one or more known signal evolutions.

8. The method of claim 4, comprising separating the mixed signal by performing a generalized auto-calibrating partially parallel acquisition (GRAPPA) operation on the mixed signal, by performing a slice generalized auto-calibrating partially parallel acquisition (slice-GRAPPA) operation on the mixed signal, or by performing a generalized auto-calibrating parallel acquisition (GRAPPA) operator (GROG) slice operation on the mixed signal.

9. The method of claim 1, comprising controlling the MRI apparatus to produce the first NMR excitation and the second NMR excitation according to a Fast-Imaging with Steady-state Precession FISP-MRF pulse sequence or an inversion recovery FISP (IR TrueFISP) pulse sequence.

10. The method of claim 1, comprising controlling the MRI apparatus to produce the first NMR excitation and the second NMR excitation according to a balanced steady state free precession (bSSFP) MRF pulse sequence.

11. The method of claim 1, where the first set of MRF parameters and the second set of MRF parameters are selected to cause the first signal evolution and the second signal evolution to be correlated less than a threshold amount.

12. The method of claim 1, where the two or more quantitative MR parameters include T1, T2, M0, and proton density, T1 being spin-lattice relaxation, T2 being spin-spin relaxation, and M0 being initial magnetization.

13. The method of claim 1, where the first set of MRF parameters and the second set of MRF parameters are selected to produce:

a different flip angle train in the first NMR excitation and the second NMR excitation, different phases in a flip angle train in the first NMR excitation and the second NMR excitation, or different magnitudes in a flip angle train in the first NMR excitation and the second NMR excitation.

14. The method of claim 1, where the first volume is a slice, where the second volume is a slice, and where the first set of MRF parameters and the second set of MRF parameters are selected to cause different gradients to be applied to the first slice and to the second slice.

15. The method of claim 14, where causing the different gradients to be applied to the first slice and to the second slice includes causing different slice select gradients to be applied to the first slice and to the second slice.

16. The method of claim 15, comprising controlling the different slice select gradients to differ before, during, or after acquiring the first NMR signals and the second NMR signals.

17. The method of claim 16, where the different slice select gradients are configured to cause a phase shift between the first slice and the second slice.

18. The method of claim 17, where the phase shift is configured to:

spatially shift the first slice and the second slice relative to each other in an image field-of-view, produce spatial blurring in at least one of the first slice or the second slice, or produce a spatial distortion in at least one of the first slice or the second slice.

19. The method of claim 18, comprising controlling the different slice select gradients to match at least one readout gradient applied during acquisition of the first NMR signals or acquisition of the second NMR signals, where the at least one readout gradient is applied in a direction different than the different slice select gradients.

20. The method of claim 19, where the at least one readout gradient comprises a first readout gradient applied in a first direction orthogonal to the slice-encoding direction and a second readout gradient applied in a second direction orthogonal to the slice-encoding direction, and where the magnetic gradient applied along the slice-encoding direction matches the at least one readout gradient by weighting a combination of the first readout gradient and the second readout gradient.

21. The method of claim 20, where the combination of the first readout gradient and the second readout gradient is an addition of the first readout gradient and the second readout gradient.

22. The method of claim 1, comprising:

controlling the MRI apparatus to create a first single volume NMR excitation in the first volume according to the first set of NMR parameters;

controlling the MRI apparatus to acquire a first single volume set of NMR signals produced by the first volume in response to the first single volume NMR excitation;

producing a first single volume signal evolution from the first single volume set of NMR signals;

simultaneously determining two or more first single volume quantitative MR parameters for a portion of the first volume based on a comparison of the first single volume evolution to one or more known signal evolutions; and producing the parameter map or the image based, at least in part, on the two or more first single volume quantitative MR parameters, where the first single volume NMR signals are acquired independently of the first NMR signals and the second NMR signals, and where the first single volume NMR excitation is active at a time other than when the first NMR excitation and the second NMR excitation are active.

23. The method of claim 22, comprising:
controlling the MRI apparatus to create a second single volume NMR excitation in the second volume according to the second set of NMR parameters;
controlling the MRI apparatus to acquire a second single volume set of NMR signals produced by the second volume in response to the second single volume NMR excitation;
producing a second single volume signal evolution from the second single volume set of NMR signals;
simultaneously determining two or more second single volume quantitative MR parameters for a portion of the second volume based on a comparison of the second single volume evolution to one or more known signal evolutions; and
producing the parameter map or the image based, at least in part, on the two or more second single volume quantitative MR parameters,
where the second single volume NMR signals are acquired independently of the first NMR signals and the second NMR signals, and
where the second single volume NMR excitation is active at a time other than when the first single volume NMR excitation, the first NMR excitation, and the second NMR excitation are active.

24. The method of claim 1, comprising acquiring the first NMR signals and the second NMR signals using different sampling patterns.

25. The method of claim 1, comprising acquiring the first NMR signals and the second NMR signals using a slice direction sensitivity encoding (SENSE) approach.

26. The method of claim 1, where creating the first NMR excitation comprises applying gradients and radio frequency (RF) energy to the first volume in a first series of variable sequence blocks, where a member of the first series of variable sequence blocks includes one or more excitation phases, one or more readout phases, and one or more waiting phases,
where the RF energy applied during a member of the first series of variable sequence blocks causes the one or more resonant species in the first volume to simultaneously produce individual NMR signals, and
where at least one member of the first series of variable sequence blocks differs from at least one other member of the first series of variable sequence blocks in at least N sequence block parameters, N being an integer greater than one,
and
where creating the second NMR excitation comprises applying gradients and RF energy to the second volume in a second series of variable sequence blocks, where a member of the second series of variable sequence blocks includes one or more excitation phases, one or more readout phases, and one or more waiting phases,
where the RF energy applied during a member of the second series of variable sequence blocks causes the one or more resonant species in the second volume to simultaneously produce individual NMR signals, and
where at least one member of the second series of variable sequence blocks differs from at least one other member of the second series of variable sequence blocks in at least M sequence block parameters, M being an integer greater than one,
and
where the first series of variable sequence blocks differs from the second series of variable sequence blocks.

27. The method of claim 26, where the sequence block parameters include echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, or an amount of gradient spoiling.

28. The method of claim 27, comprising:
controlling the MRI apparatus to vary an amount of time between sequence blocks in a series of variable sequence blocks, the relative amplitude of RF pulses in sequence blocks in a series of variable sequence blocks, or the relative phase of RF pulses in sequence blocks in a series of variable sequence blocks.

29. The method of claim 1, where the one or more known signal evolutions include signal evolutions outside the set of signal evolutions characterized by:

$$SE = A - Be^{-t/C}$$

where:
SE is a signal evolution,
A is a constant,
B is a constant,
t is time, and
C is a single relaxation parameter.

30. The method of claim 1, where the one or more known signal evolutions include a signal selected from a set of signals described by:

$$SE = \sum_{i=1}^{N_S} \prod_{i=1}^{N_A} \sum_{j=1}^{N_{RF}} R_{i(\alpha)} R_{RF_{ij}(\alpha,\phi)} R(G) E_i(T1, T2, \ldots) DPdM_0$$

or $$SE = \sum_{i=1}^{N_S} \prod_{i=1}^{N_A} \sum_{j=1}^{N_{RF}} R_i(\alpha) R_{RF_{ij}(\alpha,\phi)} R(G) E_i(T1, T2, \ldots) DPdM_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\varphi$ is a phase angle,
$Ri(\alpha)$ is a rotation due to off resonance,
$R_{RFij}(\alpha,\varphi)$ is a rotation due to RF differences, R(G) is a rotation due to a gradient,
T1 is spin-lattice relaxation,
T2 is spin-spin relaxation,
D is diffusion relaxation,
Pd is proton density,
$E_i(T1, T2, \ldots)$ is decay due to relaxation differences, and
$M_0$ is the default or equilibrium magnetization.

31. The method of claim 1, where the one or more known signal evolutions include a signal selected from a set of signals described by:

$$S_i = R_i E_i(S_{i-1})$$

where:
$S_0$ is the default or equilibrium magnetization,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

32. The method of claim 1, where the one or more known signal evolutions include a signal selected from a set of signals described by:

$$S_i = R_i E_i \sum_{x=1}^{i-1} R_x E_x(S_x)$$

or $$S_i = R_i E_i \prod_{x=1}^{i-1} R_x E_x(S_x)$$

where:
$S_0$ is the default or equilibrium magnetization,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

33. The method of claim 1, where the one or more known signal evolutions include a signal selected from a set of signals described by:

$$S_i = \sum_{s=1}^{N_s} R_{s,i} E_{s,i}(S_{s,i-1})$$

where:
$S_0$ is the default or equilibrium magnetization,
Ns is the number of spins,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

34. The method of claim 1, where the one or more known signal evolutions include a signal selected from a set of signals described by:

$$S_i = \sum_{s=1}^{N_s} R_{s,i} E_{s,i} \sum_{x=1}^{i-1} R_{s,x} E_{s,x}(S_{s,x})$$

or $$S_i = \sum_{s=1}^{N_s} R_{s,i} E_{s,i} \prod_{x=1}^{i-1} R_{s,x} E_{s,x}(S_{s,x})$$

where:
$S_0$ is the default or equilibrium magnetization,
Ns is the number of spins,
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i.

35. A method for creating a parameter map or an image from data acquired by controlling a magnetic resonance imaging (MRI) apparatus to perform magnetic resonance fingerprinting with simultaneous multivolume acquisition (MRF-SMVA), comprising:
controlling the MRI apparatus to create different nuclear magnetic resonance (NMR) excitations in a plurality of volumes in a sample using a plurality of different magnetic resonance fingerprinting (MRF) pulse sequences described by a plurality of MRF parameters;
controlling the MRI apparatus to acquire NMR signals produced by members of the plurality of volumes in response to the different NMR excitations;
producing a plurality of signal evolutions from the NMR signals;
simultaneously determining two or more quantitative magnetic resonance (MR) parameters for a volume in the plurality of volumes based on a comparison of members of the plurality of signal evolutions to one or more known signal evolutions; and
producing the parameter map or the image based, at least in part, on the two or more quantitative MR parameters,
where at least two members of the plurality of volumes have NMR excitations active simultaneously, and
where the NMR signals are acquired simultaneously from the at least two members of the plurality of volumes.

36. The method of claim 35, where at least three members of the plurality of volumes have NMR excitations active simultaneously, and where the NMR signals are acquired simultaneously from the at least three members of the plurality of volumes.

37. The method of claim 35, where at least four members of the plurality of volumes have NMR excitations active simultaneously, and where the NMR signals are acquired simultaneously from the at least four members of the plurality of volumes.

38. The method of claim 35, where at least eight members of the plurality of volumes have NMR excitations active simultaneously, and where the NMR signals are acquired simultaneously from at the least eight members of the plurality of volumes.

39. An apparatus, comprising:
an excitation logic that causes a magnetic resonance fingerprinting (MRF) apparatus to create different MRF excitations in a plurality of different slices in an object, where the different MRF excitations are active at the same time;
a nuclear magnetic resonance (NMR) logic that receives a first set of data from the MRF apparatus in response to the MRF apparatus repetitively and variably sampling a (k, t, E) space associated with the object,
where the MRF apparatus applies radio frequency (RF) energy and gradients to the object according to an MRF pulse sequence to cause the object to produce the first set of NMR signals,
where members of the first set of data are associated with different points in the (k, t, E) space, where t is time and E includes at least T1 and T2, T1 being spin-lattice relaxation and T2 being spin-spin relaxation, and where one or more of, t and E, vary non-linearly, and
where the first set of data includes signals from the plurality of slices,
a signal logic that produces one or more NMR signal evolutions from the first set of data;
a matching logic that selects, from a collection of stored signal evolutions, one or more selected stored signal evolutions that match one or more members of the one or more NMR signal evolutions to within a desired tolerance, and
a parameter map logic that simultaneously produces parameter maps or images for members of the plurality of slices based, at least in part, on the one or more selected stored signal evolutions.

40. The apparatus of claim 39, comprising:
a characterization logic that identifies the object as having a property based, at least in part, on the plurality of parameter maps, where the property describes whether the object is a diseased tissue or a healthy tissue.

41. The apparatus of claim 39, comprising a separation logic that separates the one or more NMR signal evolutions from the first set of data by performing a generalized auto-calibrating partially parallel acquisition (GRAPPA) operation on the first set of data, by performing a slice generalized auto-calibrating partially parallel acquisition (slice-GRAPPA) operation on the first set of data, or by performing a generalized auto-calibrating parallel acquisition (GRAPPA) operator (GROG) slice operation on the first set of data.

42. The apparatus of claim 39, where the MRF pulse sequences produces flip angle trains having different numbers, phases, or magnitudes in two or more members of the plurality of different slices.

43. The apparatus of claim 39, where the MRF pulse sequence causes different gradients to be applied to two or more members of the plurality of different slices before, during, or after receiving the first set of data, where the different gradients are configured to:
cause a phase shift between the two or more members of the plurality of slices,
spatially shift two or more members of the plurality of slices relative to each other in an image field-of-view,
produce spatial blurring in at least one member of the plurality of slices, or
produce a spatial distortion in at least one member of the plurality of slices.

44. The apparatus of claim 39, where the MRF pulse sequence is a Fast-Imaging with Steady-state Precession FISP-MRF pulse sequence, an inversion recovery FISP (IR TrueFISP) pulse sequence, or a balanced steady state free precession (bSSFP) MRF pulse sequence.

45. The apparatus of claim 40, where the E in the (k, t, E) space includes two or more parameters selected from the group comprising: echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, an amount of gradient spoiling, an amount of time between sequence blocks in a series of variable sequence blocks, the relative amplitude of RF pulses in sequence blocks in a series of variable sequence blocks, and the relative phase of RF pulses in sequence blocks in a series of variable sequence blocks.

46. The apparatus of claim 39, where the collection of stored signal evolutions includes a signal selected from the MRF dictionary signal equations.

47. The apparatus of claim 39, where
the excitation logic causes the MRF apparatus to create a standalone MRF excitation in a member of the plurality of different slices, where the standalone MRF excitation is not active at the same time as the different MRF excitations in the plurality of different slices;
the NMR logic receives a second set of data from the MRF apparatus in response to the MRF apparatus repetitively and variably sampling a (k, t, E) space associated with standalone MRF excitation to acquire the second set of NMR signals,
where the MRF apparatus applies RF energy and gradients to the object according to an MRF pulse sequence to cause the object to produce the second set of NMR signals,
where members of the second set of data are associated with different points in the (k, t, E) space, where t is time and E includes at least T1 and T2, T1 being spin-lattice relaxation and T2 being spin-spin relaxation, and where one or more of, t and E, vary non-linearly, and
where the second set of data includes signals from the member of the plurality of different slices that is experiencing the standalone MRF excitation,
the signal logic produces a standalone NMR signal evolution from the second set of data;
the matching logic selects, from a collection of stored signal evolutions, a selected stored signal evolution that matches the standalone NMR signal evolution to within a desired tolerance, and
the parameter map logic simultaneously produces the parameter maps or images for at least one member of the plurality of slices based, at least in part, on the selected stored signal evolution.

48. An apparatus, comprising:
- a collection logic that collects a received signal evolution from multiple simultaneously excited slices of tissue experiencing nuclear magnetic resonance (NMR) in response to a magnetic resonance fingerprinting (MRF) excitation applied to the tissue by a magnetic resonance imaging (MRI) apparatus, where members of the multiple simultaneously excited slices of tissue are experiencing different NMR;
- a data store that stores a dictionary of MRF signal evolutions, where members of the dictionary are combinations of information associated with two or more resonant species, and where information concerning the composition of the tissue with respect to the two or more resonant species is retrievable using a matched signal evolution;
- a selection logic that selects a matching member of the dictionary that is most closely related to the received signal evolution and establishes the matching member as the matched signal evolution, and
- a characterization logic that identifies a category for the tissue based, at least in part, on the composition of the tissue as identified using the matched signal evolution.

* * * * *